US010641795B2

(12) United States Patent
DeWalch

(10) Patent No.: US 10,641,795 B2
(45) Date of Patent: May 5, 2020

(54) APPARATUS, SYSTEM AND METHOD FOR SECURING AN ELECTRICAL METER TO A METER SOCKET BOX

(75) Inventor: Norman Binz DeWalch, Houston, TX (US)

(73) Assignee: DeWalch Technologies, Inc., Houston, TX (US)

(*) Notice: Subject to any disclaimer, the term of this patent is extended or adjusted under 35 U.S.C. 154(b) by 68 days.

(21) Appl. No.: 13/229,664

(22) Filed: Sep. 9, 2011

(65) Prior Publication Data
US 2012/0110829 A1 May 10, 2012

Related U.S. Application Data

(60) Provisional application No. 61/381,441, filed on Sep. 9, 2010, provisional application No. 61/381,935, filed on Sep. 10, 2010.

(51) Int. Cl.
 B21D 39/03 (2006.01)
 B23P 11/00 (2006.01)
 G01R 11/24 (2006.01)
 G01R 11/04 (2006.01)

(52) U.S. Cl.
 CPC .............. G01R 11/24 (2013.01); G01R 11/04 (2013.01); Y10T 29/49002 (2015.01); Y10T 29/49826 (2015.01)

(58) Field of Classification Search
 CPC .. E05B 65/0089; E05B 67/365; F16B 21/065; H02B 1/03; H02B 1/063
 USPC ............ 29/428, 443, 469, 506, 592.1, 854, 29/898.067; 70/19, 158, 164, 168, 232
 See application file for complete search history.

(56) References Cited

U.S. PATENT DOCUMENTS

| 3,867,822 | A | * | 2/1975 | Morse et al. .................. 70/164 |
| 4,158,953 | A | | 6/1979 | Nielsen, Jr. |
| 4,702,093 | A | | 10/1987 | DeWalch |
| D296,414 | S | | 6/1988 | DeWalch |
| 5,001,912 | A | | 3/1991 | DeWalch |
| 6,032,989 | A | * | 3/2000 | DeWalch et al. .......... 292/256.6 |
| 6,435,576 | B1 | | 8/2002 | Kusta |

(Continued)

OTHER PUBLICATIONS

U.S. Appl. No. 61/381,441, filed Sep. 9, 2010 (1 page).

(Continued)

Primary Examiner — Thiem D Phan
(74) Attorney, Agent, or Firm — DeWalch Technologies, Inc.

(57) ABSTRACT

An apparatus, system, and method for securing an electrical meter to a meter socket box. In certain embodiments, the method comprises providing a ring comprising an annular body portion having a split forming first and second ends of the annular body portion, the ring having a central axis, and further disposing at least a first flange on the first end of the annular body portion. The method further comprises disposing a retaining member on the first flange, the retaining member having a central axis generally parallel to the central axis of the ring. The retaining member, in some embodiments, comprises a body defining a bore, wherein the radial cross section is continuous in at least a portion of the bore. The method further comprises providing a housing wherein at least a portion of the housing comprises a receiver element adapted to receive a barrel lock.

20 Claims, 18 Drawing Sheets

(56) References Cited

U.S. PATENT DOCUMENTS 6,684,670 B1    2/2004  Agbay

OTHER PUBLICATIONS

U.S. Appl. No. 61/381,935, filed Sep. 10, 2010 (1 page.
Ad/Brochure/etc.—Inner-Tite, Front Entry Meter Locking Ring (1 page).—(No admission is being made regarding applicability, relevancy, materiality or otherwise and as per IDS Statement Submitted Apr. 10, 2017).
Photos/etc.—Photos delivered to Dept., Aug. 18, 2010 (2 pages).—(No admission is being made regarding applicability, relevancy, materiality or otherwise and as per IDS Statement Submitted Apr. 7, 2017).

* cited by examiner

SECTION A-A

DETAIL K

SECTION G-G

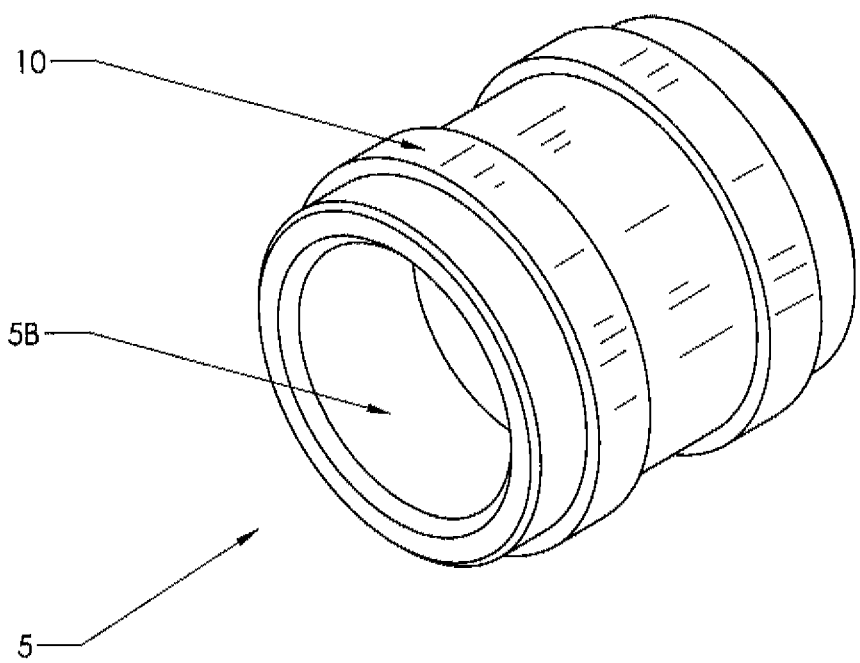
FIG. 8
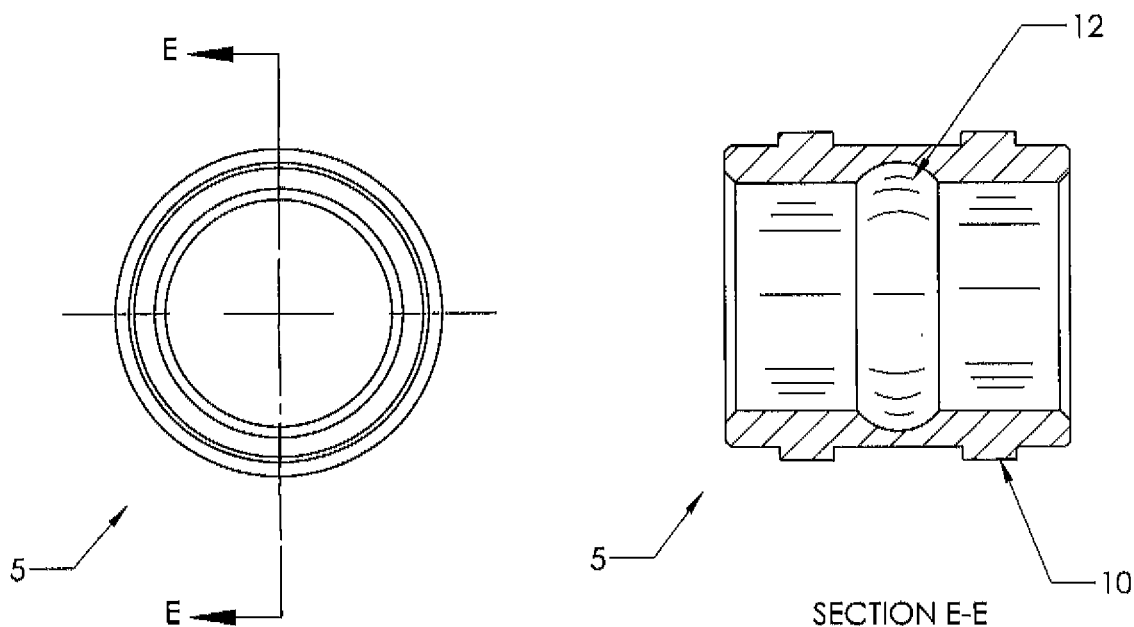
FIG. 9
SECTION E-E
FIG. 10

SECTION L-L

APPARATUS, SYSTEM AND METHOD FOR SECURING AN ELECTRICAL METER TO A METER SOCKET BOX

CROSS-REFERENCE TO RELATED APPLICATIONS

This application claims the benefit of U.S. Provisional Application No. 61/381,935, filed on Sep. 10, 2010 and U.S. Provisional Application No. 61/381,441, filed on Sep. 9, 2010.

All written material, figures, content and other disclosure in each of the above-referenced applications is hereby incorporated by reference.

BACKGROUND OF THE INVENTION

The present invention relates generally to a locking apparatus as well as a locking system and methodology, and more specifically, it relates to a meter locking ring with improved lock retention for securing an electrical meter to an electric meter socket box. In one example use, the locking apparatus or locking ring may be used to secure an electric utility meter enclosure, or for example, a watthour meter socket box to prevent unauthorized access as noted in more detail below and herein.

As noted above, one common use relates to revenue protection in the utility industry. For example, in the electric utility industry, electrical service providers generally deliver electricity to their customers via power lines buried underground or distributed along poles or towers overhead. The provider's power lines are usually distributed from a power generation station to numerous sets of customer lines, so that customers can then use the power to satisfy their various electrical needs. To measure delivered power so that customers can be billed in proportion to their usage, service providers typically terminate their power lines at a customer's home or business facility through a metered socket box, various designs for which are well known.

An example of one previously known meter box consists of two sets of electrical posts, with a provider's transmission lines being connected to one set of posts, and the customer's service lines to the other set. In order to measure the amount of electricity a customer uses, the meter box is configured to accept a watt-hour meter or another electricity usage measurement device, which, when plugged into the socket box, permits transmission of electricity from the provider to the customer and allows the amount of transmitted electricity to be measured, so that the provider can charge the customer for power usage at an appropriate rate.

Various designs and uses for watthour meters are also well known, and all such designs and uses are incorporated by reference into the teachings of the present invention. The present invention is also applicable in situations where the customer's service lines are routed from the meter box to a breaker box so that electricity can be distributed to multiple service locations using additional sets of electrical lines or wires.

Presently, there are various types of meter socket boxes, each distinguished by the manner in which the meter is secured in place once it has been plugged into an electrical socket disposed in the meter box. For example, a ringed-type meter box fitted with a flanged front cover is known, within which a watthour meter is disposed so that a head portion of the meter passes out through a flanged opening in the front cover. In this configuration, the meter is generally held in place using an annular, lockable sealing ring.

A meter box is generally used by electric utility companies, however the invention herein may be adapted and configured for use with other utility service enclosures in the gas, water, cable, TV utility industries, or in shipping or other industries as well.

One of the problems presented in certain locking devices is that the lock retainer structure adapted to receive a lock, such as a barrel lock, has a substantially, but not completely radially continuous opening. As such, a gap or seam may be present in the opening of the lock retainer structure such that a lock, such as a barrel lock having locking members or extendable locking balls, can be tampered with and removed. For example, the barrel lock can sometimes be tampered with and extracted out of the retainer by joggling and sliding one of the extended locking balls back out through the seam or gap in the opening of the lock retainer structure so as to defeat the locking arrangement. In addition, other possible disadvantages of at least some existing locking devices is that they involve more time-consuming, difficult, or inflexible manufacturing processes for making and mounting, for example, a lock retainer structure to a lockable sealing ring.

In an attempt to overcome some of these shortcomings, there have been locking devices that can be installed on meter socket boxes. Several examples of patents which disclose attempts to solve at least some of the above problems are set forth as follows.

U.S. Pat. No. 3,867,822 to Morse, et al., entitled "Locking Means for Electric Meters," sets forth a locking means for electric meters and in order to prevent unauthorized access to an electric watt-hour meter, a yoke is provided to enclose the lugs at the ends of the usual U-section split ring retaining band used to fix the receptacle for the meter works such as glass bowl enclosure therefor, to the meter base. A bolt-type lock goes through four aligned holes in the lugs and in the yoke and has transversely extensible locking members standing out beyond the fourth hole to prevent withdrawal of the bolt until unlocked. An enlarged end or head on the bolt prevents movement of the bolt in one direction, and a hood on the yoke prevents access to the other end and the locking members. This reference is incorporated by reference herein.

U.S. Pat. No. 4,158,953 to Nielsen, Jr., entitled "Front Entry Electric Meter Lock," is directed to a device which provides greater ease in locking and unlocking the means provided in prior U.S. Pat. No. 3,867,822 (noted above) for securing electric meters from tampering. The key enters from the front of the meter box instead of from the side. This reference is incorporated by reference herein.

There remains a need for a locking apparatus having retaining member that comprises a body or band defining a bore, and in some cases an opening, having a continuous radial cross section in at least a portion of the bore or opening so as to securely retain a lock such as a barrel lock within the retainer. There also remains a need for a lock retainer which is easier to manufacture and mount to a locking ring.

Those of skill in the art will appreciate the example embodiments of the present invention which addresses the above needs and other significant needs the solution to which are discussed hereinafter.

SUMMARY OF THE INVENTION

The present invention provides a locking ring apparatus, method and system having improved lock retention for securing watthour meter boxes. In accordance with one example embodiment, the locking ring apparatus with improved lock retention includes at least a ring, fastener, retaining member, housing, and barrel lock adapted to secure an electrical meter to the flanges of a meter socket box.

In an example embodiment, the apparatus includes at least a ring comprising an annular body portion having a split forming first and second ends of the annular body portion. In an example embodiment, a first flange is disposed on the first end of the annular body portion. In another example embodiment, a second flange is disposed on the second end of the annular body portion. A ring fastener, in one example, is disposed on the first end of the annular body portion. In a further example, the ring fastener is fastenable to an engageable structure disposed on the second end of the annular body portion. Ideally, the engageable structure comprises a ring fastener receiver suitable for receiving the threaded shaft of the ring fastener. It should be noted however that the ring fastener or ring fastener receiver are mounted on opposing ring ends and that either of the fastener or fastener receiver may be mounted on either the first or second ring ends as desired. The locking ring apparatus further includes at least a retaining member or retainer which may be disposed on an end or, in one example, on the first flange. In another example, the retaining member is disposed intermediate the first and second flanges. The retaining member includes at least a body defining a bore, in one example embodiment, having a continuous radial cross section in at least a portion of the bore. A retaining recess, in an example, is formed within the bore and is adapted for retaining the locking members of a barrel lock so as to releaseably capture the barrel lock within the retaining member. In an example embodiment, the retaining recess circumferentially extends so as to form a complete annular retaining recess within the bore. The body defines, in one example, a bore having a continuous radial cross section throughout the bore. The body may have a cylindrical or tubular or other configuration in various embodiments.

The apparatus further includes at least a housing comprising a housing body defining a cavity and further comprising a hollow receiver element. The housing body has an open end in communication with the cavity so as to simultaneously and receiveably capture at least a portion of the first flange and second end (or second flange in some embodiments) of the annular body portion. The hollow receiver element defines an axially extending passage (adapted to receive a barrel lock) in communication with the cavity of the housing body. The passage is coaxially alignable and further in communication with the bore of the retainer so as to receive a barrel lock. In another example, a port is formed in the housing body to aid in draining any unwanted fluids from the housing body. In one example, the housing further comprises an alignment member having structural elements adapted to align an aperture or passage of the receiver element with the bore of the retainer when the housing receiveably captures the at least a portion of the first flange and second end or flange of the annular body portion. It should also be noted that the housing and retaining member could also be configured, reoriented, and arranged in such a way the barrel lock could be inserted from either side rather than from the front of the ring.

In another example, the apparatus further includes a hollow metal ferrule preferably fitted or attached to the housing and being adapted for receiving a sealing tab or wire to indicate tampering.

In another embodiment, the retaining member may include at least an annular band having a bore therethrough with the band comprising first and second openings, such that the locking members pass completely through the band bore after which the locking members may be extended such that they may not pass back through the second end of the bore. In an example, the annular band has a first open end for receiving a barrel lock and an opposing second open end that the barrel lock shank (or shaft having the locking members) may pass through. The second end has an engagement surface for engaging or blocking the locking members (or, in some embodiments, locking balls or ball bearings), when attempting to withdraw (or extract) the lock when the locking members are in the extended, locked mode, (i.e., rather than a retracted, unlocked mode).

In one example embodiment, the retaining member is disposed (or in other embodiments, formed from or attached) on the first flange by welding (for example, projection welding). The method of attaching the retaining member to the first flange comprises providing ridges, projections, protuberances, or the like used as a surface to weld the retaining member to a first or second ring flange or in other embodiments, the first or second ring ends or other suitable portions of the annular body. In an example embodiment, the retaining member is manufactured by a turning operation, in order to more efficiently make the retaining member features. In this way, the ridges (or projections or protuberances or the like) may also be made or manufactured in the same process or manufacturing operation as the body or other portions of the retaining member.

In another example, the apparatus provides an improvement of existing barrel lock retainers which are used in conjunction with the barrel lock and the ring to secure the watthour meter.

In another example, the retaining member comprises a cylindrical hole with an annular recess. The locking members, or ball bearings of a barrel lock (in a locked mode), engage the at least a portion of surfaces forming the recess, such that the barrel lock is releaseably captured within the retaining member.

Another example embodiment provides an improvement of an existing barrel lock retaining clip formed from a stamped part. The hole in the existing clip that retains the barrel lock is generally not continuous; a weld bead or other material may be used to fill in the discontinuous portion of the clip in order to foster a more secure retention of the barrel lock and prevent the locking arrangement from being defeated by joggling or wiggling the barrel lock out of the hole. In another example embodiment, the barrel lock retainer has a continuous hole.

In alternate embodiment of the invention, the apparatus includes at least a retainer device adapted to be mounted to any of a variety of standard locking rings. The retainer device may be disposed on an end or, in one example, on a flange of the locking ring. In another example, the retaining member is disposed intermediate the first and second flanges of a standard locking ring. The retainer device includes at least a body defining a bore, in one example embodiment, having continuous radial cross section in at least a portion of the bore and wherein a retaining recess is formed within the bore and is adapted for retaining the locking members of a barrel lock so as to releaseably capture the barrel lock within the retainer device. In an example, the retaining recess circumferentially extends so as to form a complete annular retaining recess within the bore. In another example, the body defines a bore having continuous radial cross section throughout the bore. The body may have a cylindrical or tubular configuration in various embodiments.

Another example embodiment provides a method for securing an electrical meter to a meter socket box, the method including at least: providing a ring including at least an annular body portion having a split forming first and second ends of the annular body portion, the ring having a central axis; disposing at least a first flange on the first end of the annular body portion; disposing a retaining member on the first flange, the retaining member having a central axis generally parallel to the central axis of the ring; wherein the retaining member includes at least a body defining an elongated bore formed for locking a barrel lock, and wherein the radial cross section is continuous in at least a portion of the elongated bore along the central axis of the retaining member; providing a housing wherein at least a portion of the housing includes at least a receiver element and further includes at least a housing body defining a cavity; wherein the housing body forms an open end in communication with the cavity so as to receiveably capture at least a portion of the first flange and second end of the annular body portion; and wherein a first aperture is formed through the receiver element, wherein the first aperture is coaxially alignable and in communication with the elongated bore of the retaining member body so as to releaseably capture the barrel lock, wherein the housing may be secured to the ring.

In another example embodiment of the method, the method further includes at least the step of disposing a second flange on the second end of the annular body portion.

In another example embodiment of the method, the method further includes at least the step of disposing a ring fastener on the first flange of the annular body portion and disposing an engageable structure on the second flange of the annular body portion, the ring fastener being fastenable to the engageable structure.

In another example embodiment of the method, the ring fastener includes at least a threaded shaft, and wherein the engageable structure includes at least a ring fastener receiver suitable for receiving the threaded shaft of the ring fastener.

In another example embodiment of the method, the retaining member is disposed intermediate the first and second flanges.

In another example embodiment of the method, a retaining recess is formed within the elongated bore of the retaining member body and is configured for retaining a locking member of the barrel lock so as to releaseably capture the barrel lock within the retaining member.

In another example embodiment of the method, the retaining recess circumferentially extends so as to form a complete annular retaining recess within the elongated bore.

Another example embodiment provides an apparatus for securing an electrical meter to a meter socket box, the apparatus including at least: a ring including at least an annular body portion having a split forming first and second ends of the annular body portion, the ring having a central axis; a first flange disposed on the first end of the annular body portion; a retaining member disposed on the first flange, the retaining member having a central axis generally parallel to the central axis of the ring; wherein the retaining member includes at least a body defining an elongated bore formed for locking a barrel lock, and wherein the radial cross section is continuous in at least a portion of the elongated bore along the central axis of the retaining member; providing a housing wherein at least a portion of the housing includes at least eempri-ses a receiver element and further includes at least a housing body defining a cavity; wherein the housing body forms an open end in communication with the cavity so as to receiveably capture at least a portion of the first flange and second end of the annular body portion; and wherein a first aperture is formed through the receiver element, wherein the first aperture is coaxially alignable and in communication with the elongated bore of the retaining member body so as to releaseably capture the barrel lock, wherein the housing may be secured to the ring.

In another example embodiment of the apparatus, the apparatus includes at least comprises a second flange disposed on the second end of the annular body portion.

In another example embodiment of the apparatus, the apparatus includes at least comprises a ring fastener disposed on the first flange of the annular body portion and an engageable structure disposed on the second flange of the annular body portion, the ring fastener being fastenable to the engageable structure.

In another example embodiment of the apparatus, the ring fastener includes at least comprises a threaded shaft, and wherein the engageable structure includes at least comprises a ring fastener receiver suitable for receiving the threaded shaft of the ring fastener.

In another example embodiment of the apparatus, the retaining member is disposed intermediate the first and second flanges.

In another example embodiment of the apparatus, a retaining recess is formed within the elongated bore of the retaining member body and is configured for retaining a locking member of the barrel lock so as to releaseably capture the barrel lock within the retaining member.

In another example embodiment of the apparatus, the retaining recess circumferentially extends around an interior surface forming the bore of the retaining member so as to form a complete annular retaining recess within the elongated bore.

In another example embodiment of the apparatus, the bore includes at least at least one chord, and wherein when a configuration of the bore includes at least more than one chord, one chord is sized so that every chord of the bore is smaller than the maximum chord defined by the shank, and wherein the locking member includes at least at least one locking member when the lock is in a locked configuration, and wherein at least one chord of the at least one chord might not pass through the center of the lock receiving bore, and wherein at least one chord of the at least one chord may pass through the center of the bore.

In another example embodiment of the apparatus, the bore includes at least at least one chord, and wherein when a configuration of the bore includes at least more than one chord, the largest chord that may be measured in the bore is smaller than the largest chord that may be measured between the shank and at least one locking member on the lock. In another example embodiment of the apparatus, the bore includes at least at least one chord, and wherein when a configuration of the bore includes at least more than one chord, one chord is sized so that every chord of the bore is smaller than the maximum chord defined by the shank, and wherein the locking member includes at least at least one locking member when the lock is in a locked configuration, and wherein the lock retaining member includes at least a stiffened material to reduce flexure of the receiving member In another example embodiment of the apparatus, the bore includes at least at least one chord, and wherein when a configuration of the bore includes at least more than one chord, the largest chord that may be measured in the bore is smaller than the largest chord that may be measured between the shank and at least one locking member on the lock.

In another example embodiment of the apparatus, the apparatus includes at least a plurality of chords, wherein at least one chord does not pass through the center of the lock receiving bore, and wherein at least one chord does pass through the center of the bore.

Another example embodiment provides an apparatus for securing an electrical meter to a meter socket box, the apparatus including at least: a ring including at least an annular body portion having a split forming first and second ends of the annular body portion, the ring having a central axis; a first flange disposed on the first end of the annular body portion, and further including at least a second flange disposed on the second end of the annular body portion; a retaining member disposed intermediate the first and second flanges, the retaining member having a central axis generally parallel to the central axis of the ring; wherein the retaining member includes at least a body defining an elongated bore formed for locking a barrel lock, and wherein the radial cross section is continuous in at least a portion of the elongated bore along the central axis of the retaining member; providing a housing wherein at least a portion of the housing includes at least a receiver element and further includes at least a housing body defining a cavity; wherein the housing body forms an open end in communication with the cavity so as to receiveably captures at least a portion of the first and second flanges; and wherein a first aperture is formed through the receiver element, and wherein the housing further includes at least an alignment member having structural elements adapted to align the aperture of the first aperture of the receiver element with the elongated bore of the retainer member, and wherein the first aperture is coaxially alignable and in communication with the elongated bore of the retaining member body so as to releaseably capture the barrel lock, wherein the housing may be secured to the ring.

In another example embodiment of the apparatus, the apparatus includes at least a ring fastener disposed on the first flange of the annular body portion and an engageable structure disposed on the second flange of the annular body portion, the ring fastener being fastenable to the engageable structure.

In another example embodiment of the apparatus, the elongated bore includes at least an interior surface, and wherein a retaining recess is formed within the interior surface, the retaining recess circumferentially extending around the interior surface so as to form a complete annular retaining recess within the elongated bore, wherein the retaining recess is configured for retaining a locking member of the barrel lock so as to releaseably capture the barrel lock within the retaining member.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining the device of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

Another aspect of the present invention is to retain a lock in the ring.

Another aspect of the present invention is to improve the existing lock retaining clip.

In another embodiment, an advantage is that the lock retaining member is restricted in a way so as to prevent the barrel lock from being manipulated when locked in the ring to remove the lock without unlocking it. Receiving members in the prior art have been formed from sheet metal. The bore of the prior art retaining member is therefore not uniform and has a gap portion where the two ends of the sheet metal are joined. This gap portion allows the locking member on a barrel lock to be aligned with it and with hand force, pulled through the gap thus allowing the lock to be removed without unlocking the lock.

In an example embodiment of the present invention, the retaining member is designed to have a bore for receiving the shank of a barrel lock. The lock receiving bore is sized so that every chord of the bore is smaller than the maximum chord defined by the shank and the locking member when the lock is in the locked configuration. A barrel lock is provided with a shank, locking member (a ball in some embodiments), and head. In an example embodiment, a maximum chord measured between the shank and the locking member. In example embodiments of chords, some are created at different points in the lock receiving bore of the lock retaining member. It may be noted that a chord may not pass through the center of the lock receiving bore while another chord does. The bore is generally circular but may be irregular and of any shape. In an example embodiment, the largest chord that may be measured in the bore is smaller than the largest chord that may be measured between the shank and at least one locking member on the lock. This geometry prevents the lock from being manipulated and removed from the lock retaining member on the ring. In further embodiments of the present invention the stiffness of the lock retaining member may be increased to reduce flexure of the receiving member. This will prevent the retaining member from being flexed in a way so as to increase the maximum chord to allow a lock to be removed from the locking member without being unlocked. In an example embodiment, a retaining member having a central axis generally parallel to the central axis of the ring (although in other embodiments, these axes may be other than generally parallel).

In an example embodiment, an apparatus and method is provided for securing an electrical meter to a meter socket box. In certain embodiments, the method comprises providing a ring comprising an annular body portion having a split forming first and second ends of the annular body portion, the ring having central axis (e.g., similarly oriented in some embodiments as in other example embodiments) and further disposing at least a first flange on the first end of the annular body portion. The method further comprises disposing a retaining member on the first flange, the retaining member having a central axis (e.g., similarly oriented in some embodiments as in other example embodiments) generally parallel to the central axis of the ring. The retaining member may be made from any material suitable for securing a barrel lock or other type locking device. The retaining member is preferably attached to the first ring end (e.g., by welding, fasteners, adhesives, or other fastening systems) but in some embodiments may be loosely captured between the ring ends and cooperatively configured to be aligned with the housing body and receiver element to receive a locking device. The retaining member, in some embodiments, comprises a body defining a bore, wherein the radial cross section is continuous in at least a portion of the bore along the central axis of the retaining member. The method further comprises providing a housing wherein at least a portion of the housing comprises a receiver element and further comprises a housing body defining a cavity, wherein the housing body forms an open end in communication with the cavity so as to receiveably capture at least a portion of the first flange and second end of the annular body portion, and wherein a first aperture is formed through the receiver element. Further, the first aperture is coaxially alignable and in communication with the bore of the retainer so as to receive a barrel lock.

Other aspects and advantages of the present invention will become obvious to the reader and it is intended that these aspects and advantages are within the scope of the present invention.

To the accomplishment of the above and related aspects as well as objects, this invention may be embodied in the form illustrated in the accompanying drawings, attention being called to the fact, however, that the drawings are illustrative only, and that changes may be made in the specific construction illustrated.

The content and disclosure of each of the following applications/publications, as well as their related parent or child continuation, continuation-in-part or divisional applications, as permitted are specifically hereby incorporated by reference:

U.S. Provisional Application No. 61/381,935, U.S. Provisional Application No. 61/381,441, U.S. Patent Nos. 61/381,441, U.S. Pat. Nos. 4,742,703, 6,386,006, 7,213,424, 7,176,376; and U.S. patent application Ser. Nos. 12/380,938, 12/378,879, 12/317,086, 12/082,122, 61/316,851, 61/293,724, U.S. Ser. No. 12/763,170 and 61/316,910.

Additionally, all written material, figures, content and other disclosure in each of the above-referenced applications, as well as their related parent or child continuation, continuation-in-part or divisional applications, is hereby incorporated by reference. In addition, the instant application claims priority as noted above.

There has thus been outlined, rather broadly, features of example embodiments of the invention in order that the detailed description thereof may be better understood, and in order that the present contribution to the art may be better appreciated. There are additional features of example embodiments of the invention that will be described hereinafter.

In this respect, before explaining at least one example embodiment of the invention in detail, it is to be understood that the example embodiments are not limited in its application to the details of construction and to the arrangements of the components set forth in the following description or illustrated in the drawings. Various example embodiments are capable of other further embodiments and of being practiced and carried out in various ways. Also, as emphasized, it is to be understood that the phraseology and terminology employed herein are for the purpose of the description and should not be regarded as limiting.

To the accomplishment of the above and related aspects, example embodiments of the invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

The drawings as noted below form part of the present specification and are included to further demonstrate certain aspects of example embodiments of the invention. Various other aspects, features and attendant advantages of the embodiments of the invention will become fully appreciated as the same becomes better understood when considered in conjunction with the accompanying drawings, in which like reference characters designate the same or similar parts throughout the several views, and wherein:

FIG. 8 is a perspective view of the lock retainer.

FIG. 9 is a side view of the locking retainer.

FIG. 10 is a sectional view of the lock retainer.

FIG. 24A provides a view of an example embodiment of the invention showing a barrel lock with shank, locking member (a ball in the example embodiment), and head.

FIG. 24B provides a view of an example embodiment of the invention showing a cross-section of at 204 shown in FIG. 24A.

FIG. 24C provides a view of an example embodiment of the invention showing a cross sectional view of an example embodiment lock retaining member attached to a portion of a ring.

FIG. 24D provides a view of an example embodiment of the invention showing a retaining member having a central axis generally parallel to the central axis of the ring (although in other embodiments, the these axes may be other than generally parallel.

FIGS. 1-24D generally (as well as each of the figures U.S. Provisional Application Nos. 61/381,935 and 61/381,441; all written material, figures, content and other disclosure in each of the above-referenced applications is hereby incorporated by reference) include various views of embodiments including certain members, components, structures, and configurations in accord with possible embodiments of the invention as well as various barrel locking systems.

While various example embodiments of the invention will be described herein, it will be understood that it is not intended to limit the invention to those embodiments. On the contrary, it is intended to cover all alternatives, modifications, and equivalents included within the spirit of the invention.

DETAILED DESCRIPTION OF THE INVENTION

Turning descriptively to the drawings, the attached figures illustrate a locking ring apparatus, method and system having improved lock retention for securing watthour meter boxes. In an example embodiment, a locking ring apparatus with improved lock retention comprises a ring, fastener, retaining member, housing, and barrel lock adapted to secure an electrical meter to the flanges of a meter socket box.

Figure 1:
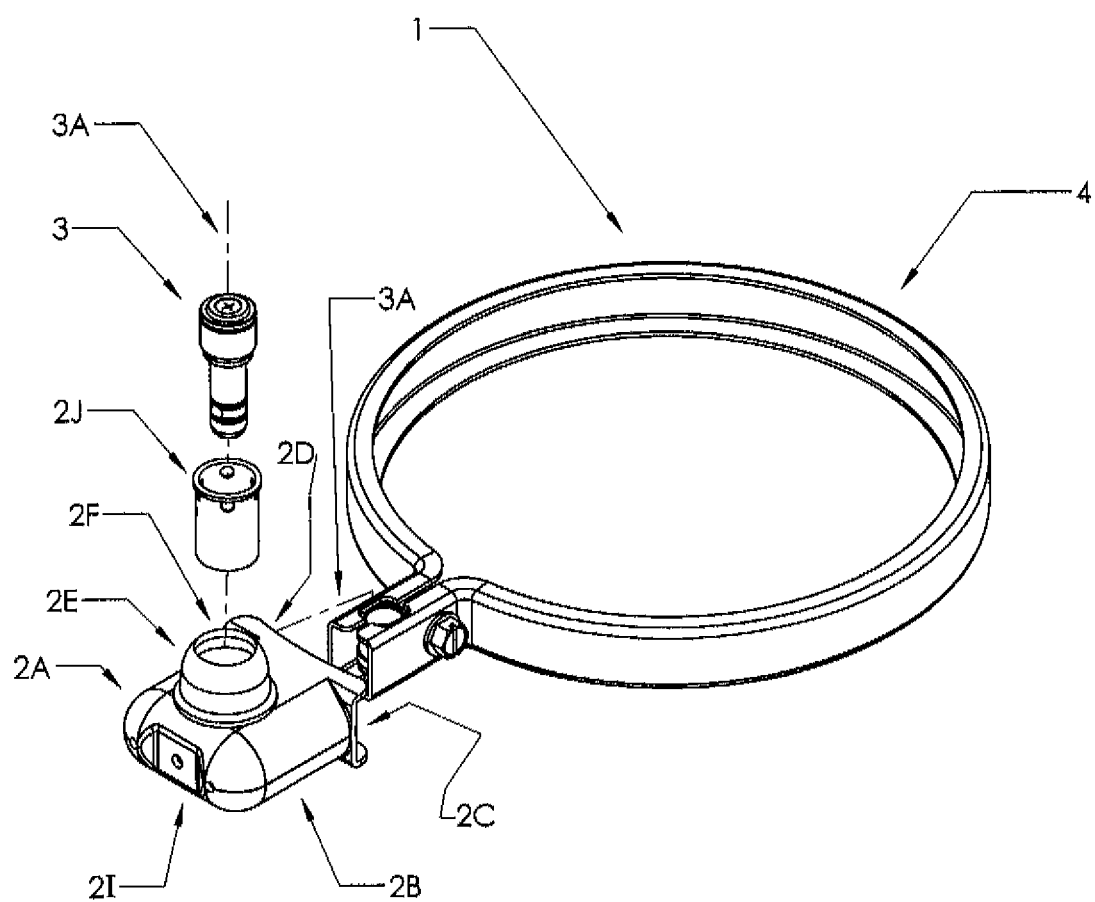
FIG. 1 is a perspective exploded view of the meter locking assembly.
Figure 2:
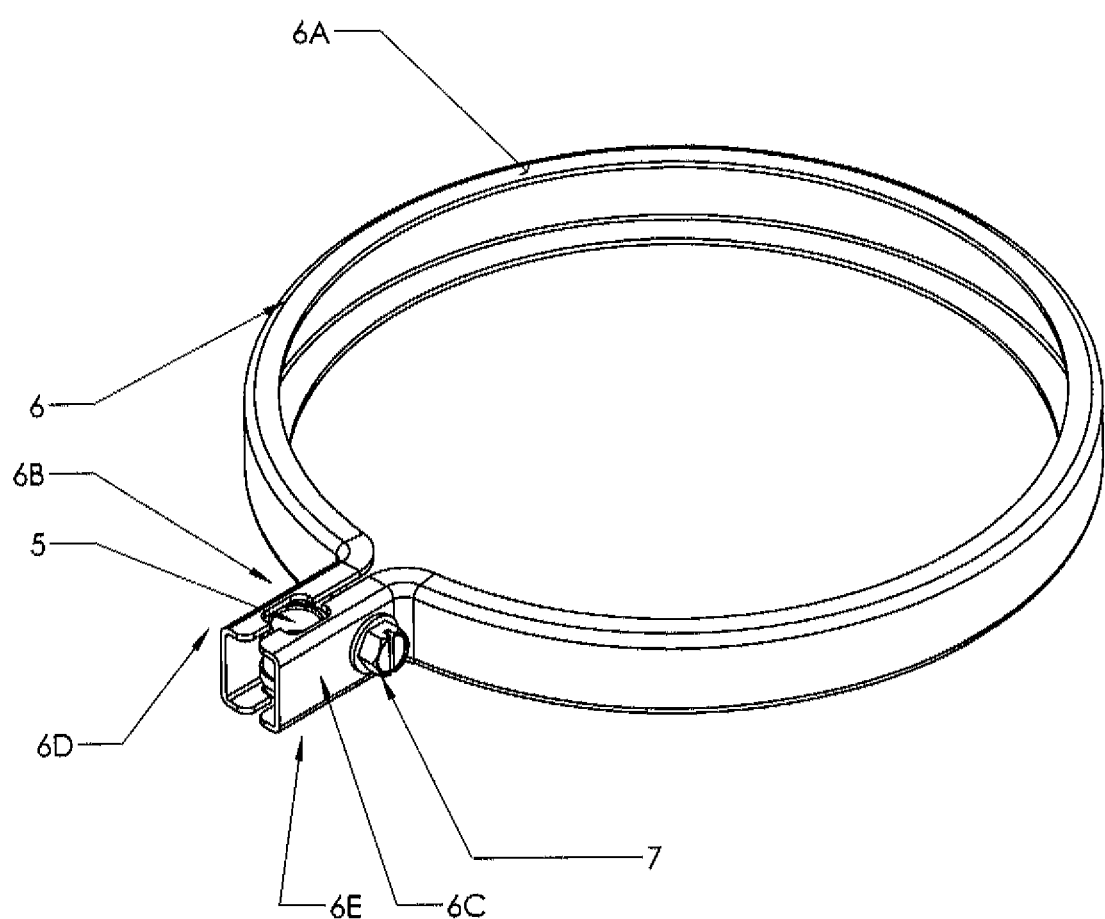
FIG. 2 is a perspective view of the ring subassembly.
Figure 3:
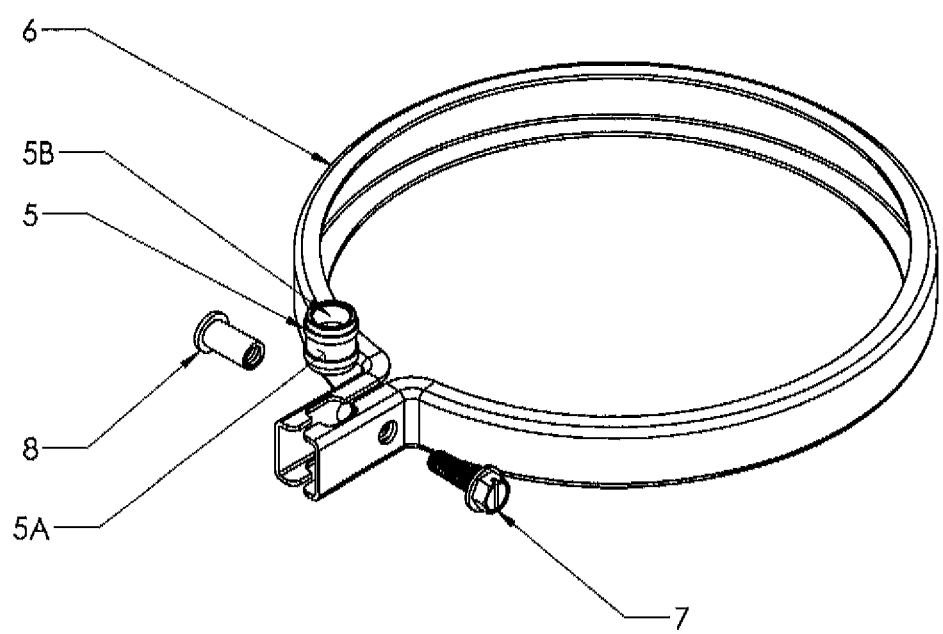
FIG. 3 is a perspective exploded view of the ring subassembly.
Figure 4:
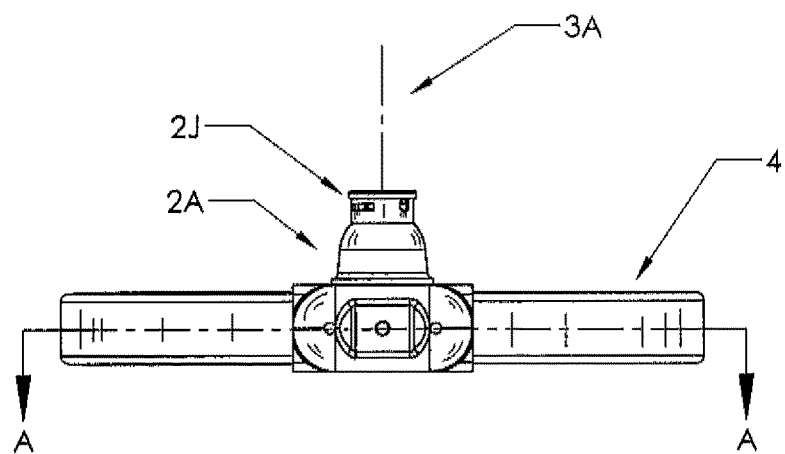
FIG. 4 is a bottom view of the meter locking assembly.

Referring now to FIGS. 1-3, in an example embodiment, the locking ring apparatus 1 comprises a ring assembly 4, housing 2A and lock 3 for securing an electrical meter to a meter socket box. The ring assembly 4 comprises an annular body portion 6A having a split forming first and second ends 6B, 6C of the annular body portion. In an example embodiment, a first flange 6D is disposed on (or formed from or attached to in other embodiments) the first end of the annular body portion. In another example embodiment, a second flange 6E is disposed on the second end 6C of the annular body portion.

A ring fastener, in one example, is disposed on the first end (or second end in some embodiments) of the annular body portion. The ring fastener 7 comprises, in one example embodiment, a threaded shaft or screw or the like disposed on the first end. In a further example, the ring fastener 7 is fastenable to an engageable structure disposed on the second end of the annular body portion. Ideally, in one example, the engageable structure comprises a ring fastener receiver 8 suitable for receiving the threaded shaft of the ring fastener (other non-limiting examples, include nuts and bolts, clamps, any of a number suitable locking devices, flexible ties or other connector systems or the like). It should be noted however that the ring fastener or ring fastener receiver are mounted on opposing ring ends and that either of the fastener or fastener receiver may be mounted on either of the first or second ring ends. The ring fastener receiver 8 is ideally suitable for receiving the threaded shaft of the ring fastener 7 and is adapted to be fastened by the threaded shaft so as to snugly or sufficiently draw together ring ends 6D, 6E to attach an electric meter to the meter box flanges (see FIGS. 21-24 and generally FIGS. 1-24D).

The ring assembly 4 further comprises a retaining member or retainer 5 which may be disposed on an end or, in one example, on the first flange 6D. In another example, the retaining member 5 is disposed intermediate the first and second flanges 6D, 6E. In other examples, the retaining member 5 is attached, welded or captured between the first flange and second flange 6D, 6E. It should be noted that the fastener combination 7, 8 has the dual function, in some embodiments, of securing the ring ends 6A, 6B and also capturing (releaseably in some embodiments) the retainer 5.

Figure 14:
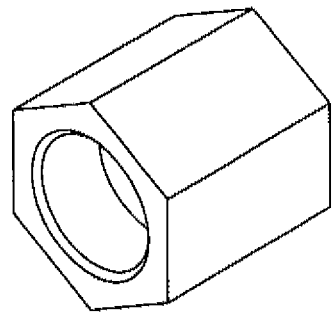
FIG. 14 is another example embodiment of the lock retainer.
Figure 15:
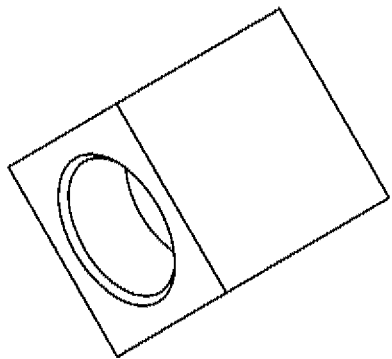
FIG. 15 is another example embodiment of the lock retainer.

The retaining member 5 comprises a body 5A, as shown in FIGS. 3, 8-10 defining a bore 5B, in one example embodiment, having continuous radial cross section (for example, as shown in FIG. 9) in at least a portion of the bore. In one example, a retaining recess 12 is formed within the bore and is adapted for retaining the locking members of a barrel lock so as to releaseably capture the barrel lock within the retaining member. In an example, the retaining recess 12 circumferentially extends so as to form a complete annular retaining recess within the bore. In another example, the body defines a bore having a continuous radial cross section throughout the bore. The body may have a cylindrical or tubular or other configuration in various embodiments. In an example, the bore size has a generally uniform radius so as to prevent unauthorized extraction of the barrel lock. In other embodiments the recess may only be segmented and formed only intermittently or for part of the circumferential internal surface. It should be noted that the annular recess is, in some embodiments, located equidistantly between first and second open ends of the bore. With such a configuration, the retainer is reversible such that a lock may be inserted through either end and retained. As such, the locking ring apparatus has a reversible configuration and, in some embodiments, may be mounted with either side of the ring facing the front of the meter box (for example see item 100 in FIG. 22). In other embodiments, the retainer may also have a square or polygonal configuration as shown in FIGS. 14 and 15 as will be discussed further.

Referring now to FIGS. 1-5, the apparatus further comprises a housing 2A comprising a housing body 2B defining a cavity 2C and further comprising a hollow receiver element 2E. The housing body has an open end 2D in communication with the cavity so as to simultaneously and receiveably capture at least a portion of the first flange and second end (or second flange in some embodiments) or ring ends 6B, 6C of the annular body portion. The hollow receiver element defines an axially extending passage 2F (adapted to receive a barrel lock along axis 3A) in communication with the cavity 2C of the housing body. The passage 2F is coaxially alignable (along axis 3A) and further in communication with the bore 5B of the retainer so as to receive a barrel lock 3.

Figure 5:
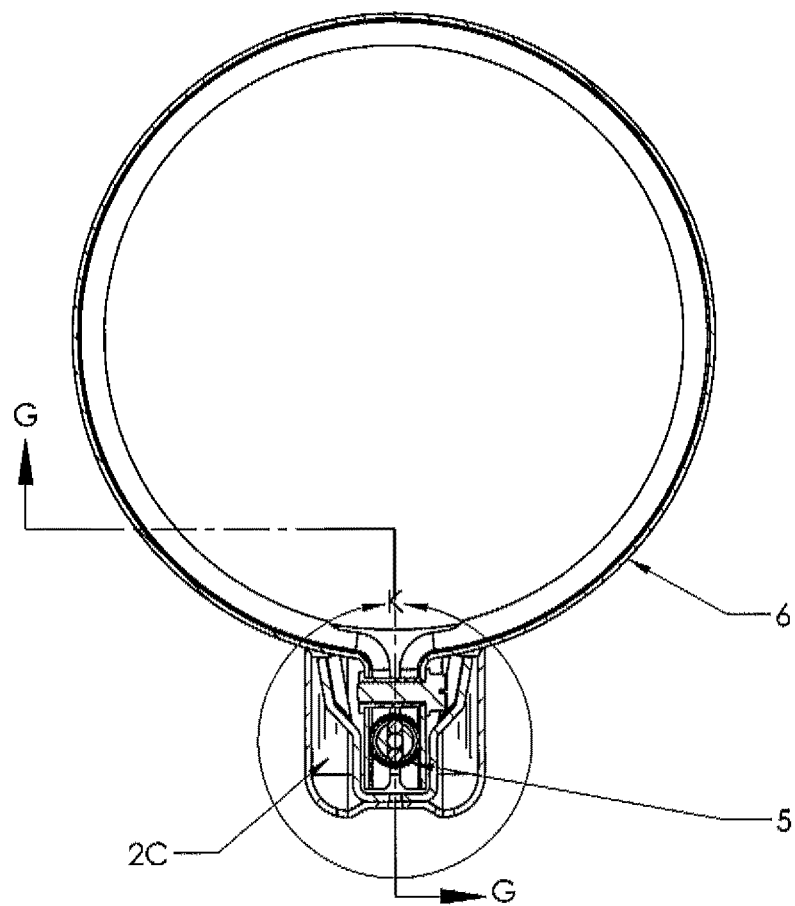
FIG. 5 is a sectional view of the meter locking assembly showing the lock retainer.
Figure 6:
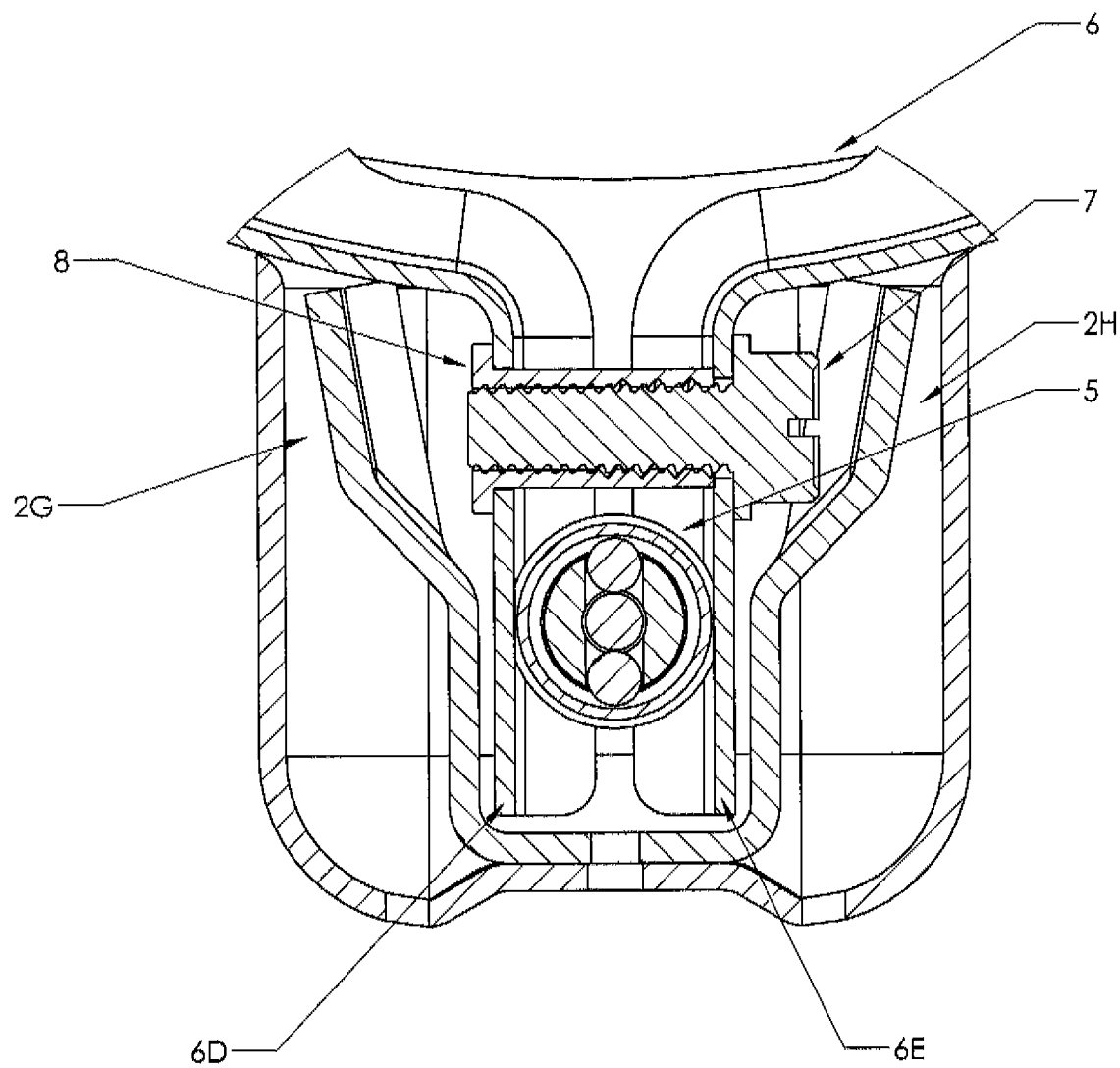
FIG. 6 is a detailed sectional view of the meter locking assembly showing the lock retainer retaining the barrel lock.

As shown in FIGS. 5 and 6, in one example, the housing further comprises an alignment member having structural elements 2G, 2H adapted to align the passage of the receiver element with the bore of the retainer (along axis 3A) when the housing 2A is installed or mounted over and receiveably captures the at least a portion of the first flange 6D and second flange 6E or end of the annular body portion. It should also be noted that the housing and retaining member could also be configured, reoriented, and arranged in such a way the barrel lock 3 could be inserted from the side rather than from the front of the ring. In another example, a port 2G is formed in the housing body 2B to aid in draining any unwanted fluids (e.g., rain water, etc.) from the housing body.

Figure 13:
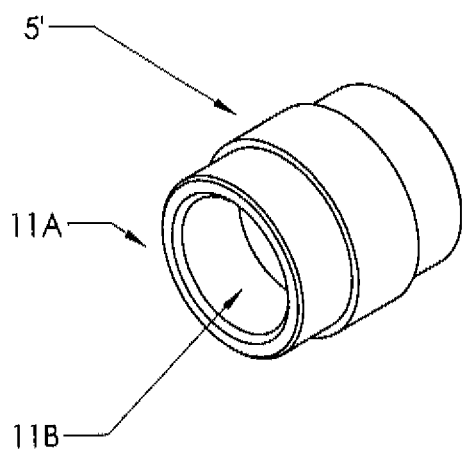
FIG. 13 is an example embodiment of the lock retainer.
Figure 13A:
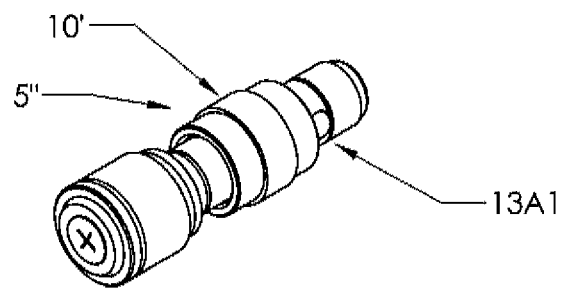
FIG. 13A is an example embodiment of the lock retainer.

In another example, the apparatus further comprises a hollow metal ferrule 2H preferably fitted or attached to (or press fit into) the housing 2A and adapted to receive a sealing tab or wire to indicate tampering or the like. Turning now to FIG. 13A, in another embodiment, the retaining member comprises annular band 5" having a bore therethrough with the band comprising first and second openings, such that the locking members 13A1 pass completely through the bore after which the locking members 13A1 may be extended such that the lock may not be extracted back through the second end of the bore. In an example, the annular band has a first open end for receiving a barrel lock (as shown in FIG. 13A) and an opposing second open end that the barrel lock shank (or shaft having the locking members 13A1) may pass through. The second end has an engagement surface for engaging or blocking the locking members (or, in some embodiments, balls, or ball bearings), when attempting to withdraw (or extract) the lock when the locking members are in the extended, locked mode, (i.e., rather than a retracted, unlocked mode). It should also be recognized, that an annular recess would not be needed in this configuration.

Referring now to FIGS. 8-10, in one example embodiment, the retaining member 5 is disposed (or in other embodiments, formed from or attached) on, for example, the first flange 6D by welding (for example, projection welding). The method of attaching the retaining member to the first flange comprises providing ridges 10, projections, protuberances, or the like used as a surface to weld the retaining member to a first or second ring flanges, or in other embodiments, the first or second ring ends or other suitable portions of the annular body 6A. In an example embodiment, the retaining member 5 is manufactured by a turning operation, in order to more efficiently make the retaining member features. In this way, the ridges 10 (or projections or protuberances or the like) may also be made or manufactured in the same process or manufacturing operation as the body 5A or other portions of the retaining member 5.

As noted, the lock retaining member or retainer 5 is, in some embodiments, welded on the ring 6. In one example embodiment, the lock retainer 5 is welded on to the ring 6 using spot welding process; the projection ridges 10 on the barrel lock retainer 5 aid in the spot welding process as noted. This can be more clearly seen in the example embodiment shown in FIGS. 1-24D generally, as well as FIGS. 3 and 6 particularly. In use, as briefly noted, after completion of ring assembly 4, the housing 2A is inserted and mounted over the ring ends or flanges and the metal ferrule 2J and the barrel lock 3 are installed along axis 3A (see FIGS. 1-24D generally). As explained, referring to FIGS. 5-7, the barrel lock 3 is retained in the ring 6 with the aid of the lock retainer 5. Referring to FIG. 13, another example embodiment is shown of retainer 5' having an open end and bore 15 but only one ridge or protuberance.

In another example, the locking ring apparatus provides an improvement over existing barrel lock retainers and is useable in conjunction with various barrel lock systems and methods to secure a watthour meter (see for example, barrel locking systems shown in FIGS. 1-24D generally).

In another example, the retaining member comprises a cylindrical hole with an annular recess. The locking members, (or ball bearings 14, for example, shown in FIG. 7) of a barrel lock, engage the at least a portion of surfaces forming the recess, such that the barrel lock is releaseably captured within the retaining member.

Figure 11:
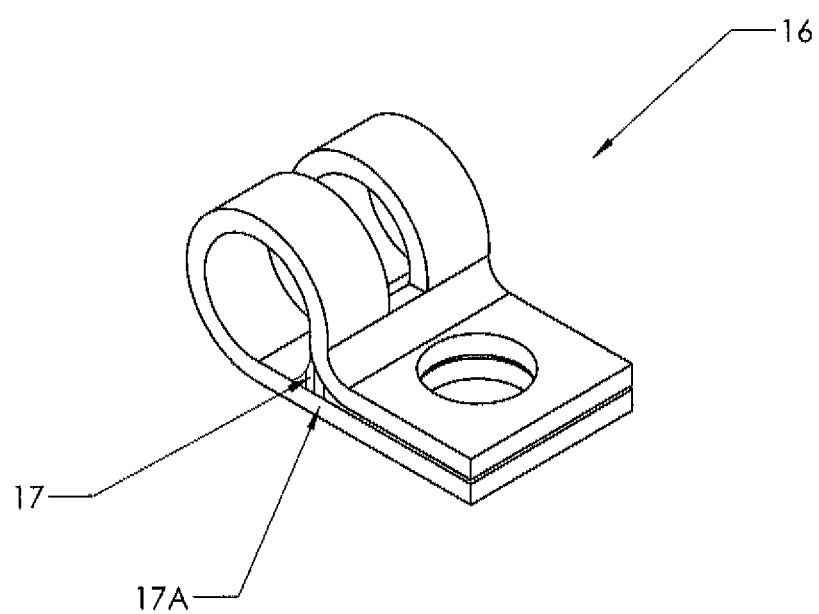
FIG. 11 is a perspective view of an existing lock retaining clip.
Figure 12:
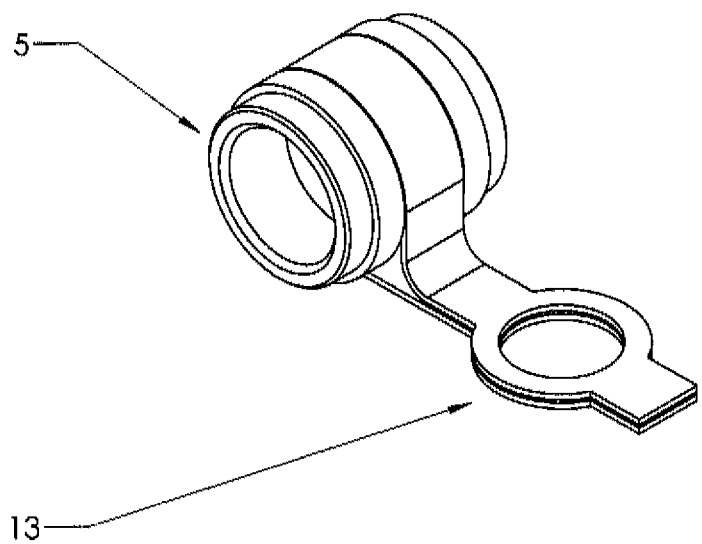
FIG. 12 is a perspective view showing a strap or mounting member for securing the retainer to the ring.

Turning now to FIG. 11, another example embodiment provides an improvement of an existing barrel lock retaining clip 16 formed from a stamped part or sheet metal. The hole in the existing clip that retains the barrel lock is generally not continuous (as can be seen in the region designated by item 17) creating a gap or seam which can be exploited if attempting to defeat the locking hardware. As noted earlier, this is a drawback, as the barrel lock can be joggled or wiggled back and forth such that one of the extended locking balls can then still be slid out through the seam thereby making the device insecure. As noted above, one aspect of the invention is to overcome the disadvantage of such lock retainer devices, similar to, for example, clip 16 (shown in FIG. 11). As such, it would be advantageous to close the region or discontinuity, for example, by selectively adding a weld bead 17A (shown in dashed lines) or other material in the region 17 in order to fill in the discontinuous portion of the clip so as to foster more secure retention of the barrel lock and prevent the locking hardware from being defeated by joggling or wiggling the barrel lock out of the hole. In another example embodiment, the barrel lock retainer has a continuous hole.

It will be appreciated that the locking member or lock retainer 5 is formed to provide a continuous bore or hole so as to overcome these drawbacks as noted. In one example embodiment, the lock retainer 5 is cylindrical in shape on both the interior and the exterior making it easy to manufacture as noted above as it can made by a turning operation. It also facilitates the assembly process. The combined configuration of these lock retainer features provides increased security as well as cost efficiency.

In another example, in order to hold the meter in place and prevent the its removal from the meter box, both the meter and meter box base incorporate a corresponding set of flanges, discussed briefly above, that are retained together with an annular, lockable sealing ring 6. The ring, also referred to as lockable sealing ring 6, is designed to encase and captivate the corresponding flanges of the meter and box base. As noted, a barrel lock assembly 3 is then used in conjunction with the sealing ring 6 comprising fastener 7, 8 and housing 2A in order to hold the ends of the sealing ring 6 together. It should be noted that different types of barrel locks may be used as noted above and as shown in FIGS. 1-24D generally. Most barrel locks require a key in order to install the lock into or remove the lock from the retainer and housing and then engage or disengage the sealing ring 6 from the meter and base box as desired.

Figure 7:
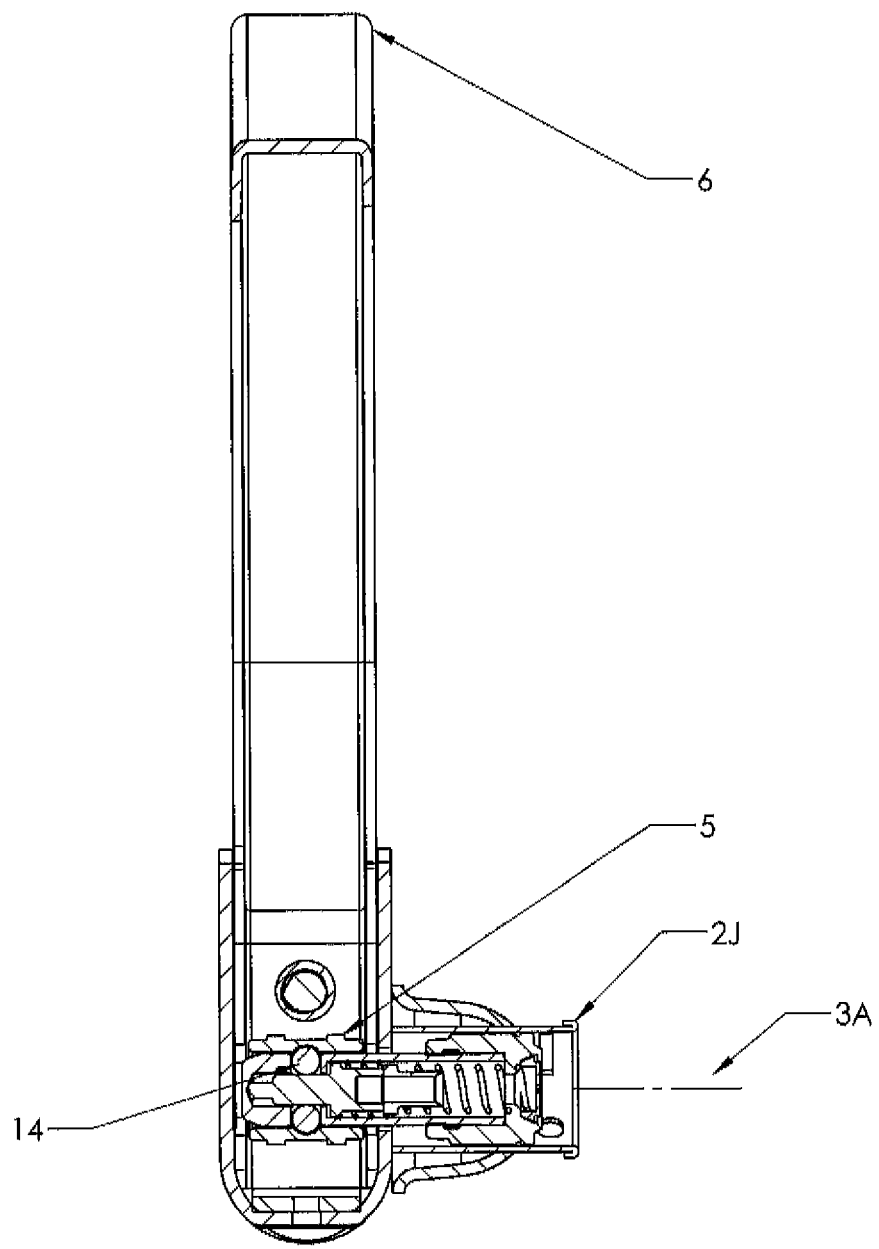
FIG. 7 is another sectional view of the meter locking assembly showing the lock retainer retaining a barrel lock when in a locked mode.

As noted above, and illustrated in FIGS. 2-3, the retaining member or lock retainer 5 is a part of what may be referred to as ring assembly 4. As noted, FIGS. 5-7 show different sectional views of the assembly where the barrel lock 3 is retained the lock retainer 5. In addition, FIG. 8 shows a perspective view of the lock retainer 5. As it can be seen from the figures, and noted above, lock retainer 5 is a turned part with a bore or cylindrical thru hole 5B and projection ridges 10 on the outer surface.

In another aspect of the invention, it will be appreciated that the housing 2A and retainer 5, intercooperate to not only protectively shield and secure the ring ends 6B, 6C together, as well as flanges 6D, 6E together in some embodiments, but also to generally align the overall locking receiving passageway for releaseably capturing a barrel lock. In this way, the housing 2A, retainer 5 and lock 3 interengage so as to effectively secure and lock the ring in a locked mode around the electric meter and meter box flanges Referring now to FIG. 9, an example embodiment is provided showing the side view of the lock retainer 5; FIG. 10 shows the sectional view of the lock retainer 5 and illustrates the internal, annular recess 12 which aid in enabling improved retention of a barrel lock. The retainer is in effect captured between the ring ends in such a location so as to be in substantial coaxial alignment with the aperture formed in the housing, wherein the retainer and housing opening form a substantially aligned passageway adapted for releaseably receiving a barrel lock as noted.

In another embodiment the retainer may be formed with a engageable member such that it may be secured between the ring ends or to at least one ring end with a suitable fastener, or in some embodiments items 7, 8, without having to be welded in place. In this way, the retainer 5 may be readily interchangeable or replaceable, if desired, with a different retainer having other features, for example, such as rotation restriction surfaces cooperable with complementary rotation restriction surfaces on a barrel lock or the like.

Figure 18:
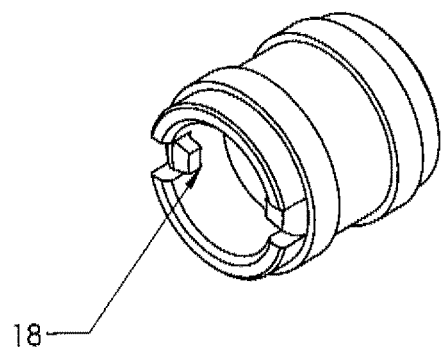
FIG. 18 is a perspective view of the rotation restricted or anti-rotation embodiment of the lock retainer.
Figure 18A:
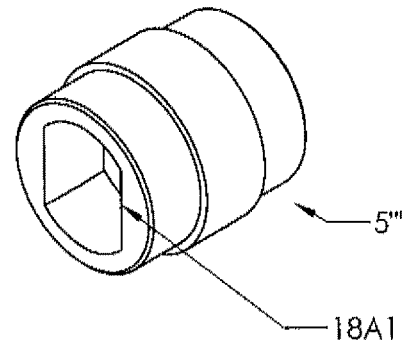
FIG. 18A is a perspective view of the rotation restricted or anti-rotation embodiment of the lock retainer.
Figure 19:
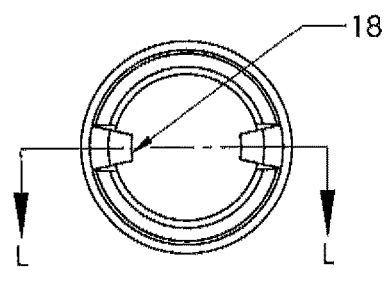
FIG. 19 is a side view of the rotation restricted or anti-rotation embodiment of the lock retainer.
Figure 20:
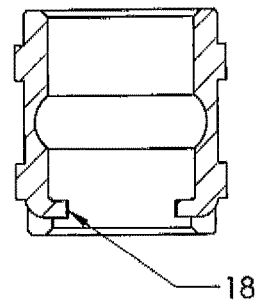
FIG. 20 is a sectional view of the rotation restricted or anti-rotation embodiment of the lock retainer.
Figure 18B:
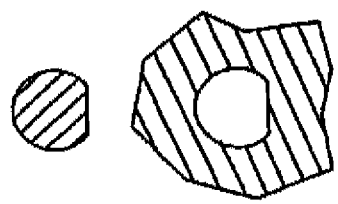
FIGS. 18B-18I provide other example embodiments of the lock retainer showing rotation restricted or anti-rotation embodiments of the lock retainer and cross-sections of cooperating barrel lock shanks or shafts.
Figure 18C:
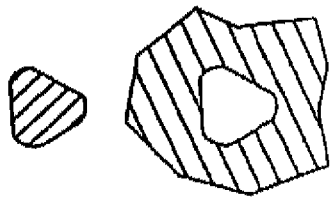
Figure 18D:
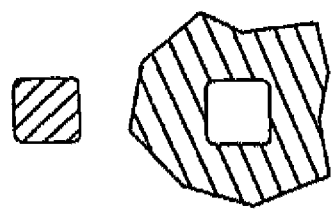
Figure 18E:
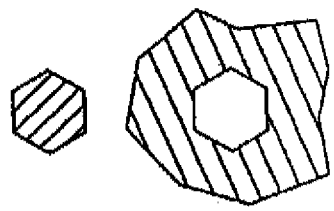
Figure 18F:
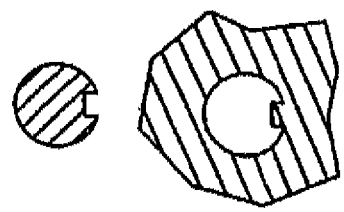
Figure 18G:
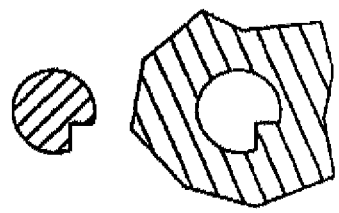
Figure 18H:
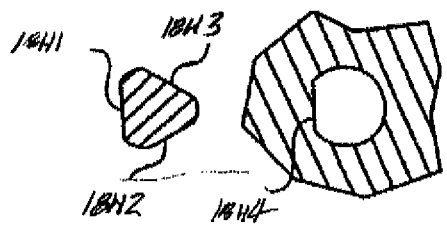
Figure 18I:
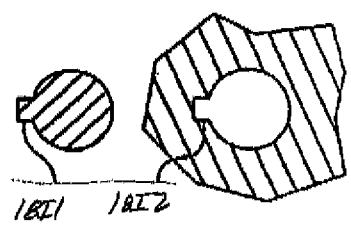
Figure 21:
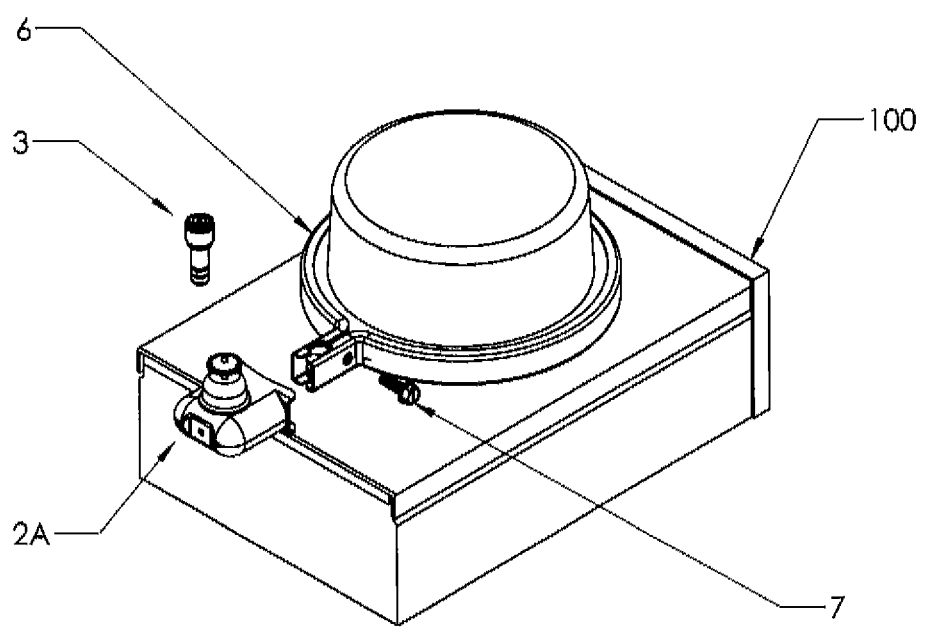
FIGS. 21-24 provide a perspective view of an example embodiment of the invention showing the locking ring and retainer, housing, ferrule, and barrel locking system and methodology for securing an electric meter to an electric meter box.
Figure 22:
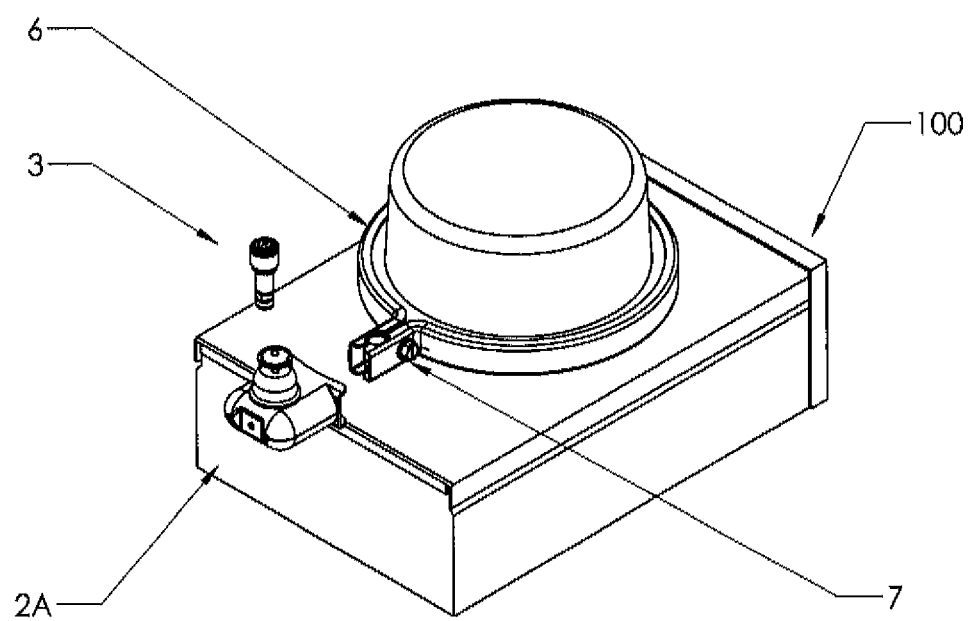
Figure 23:
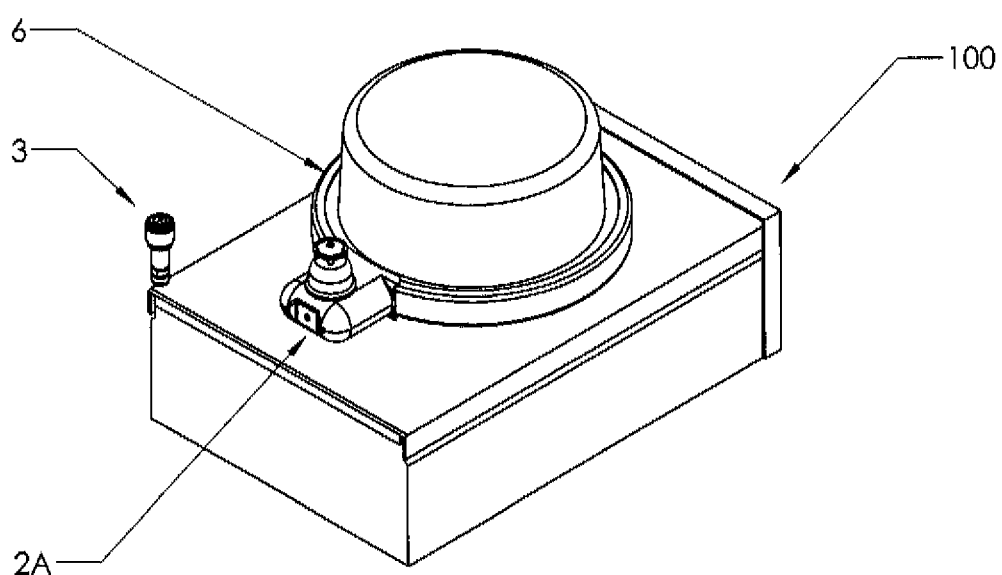
Figure 24:
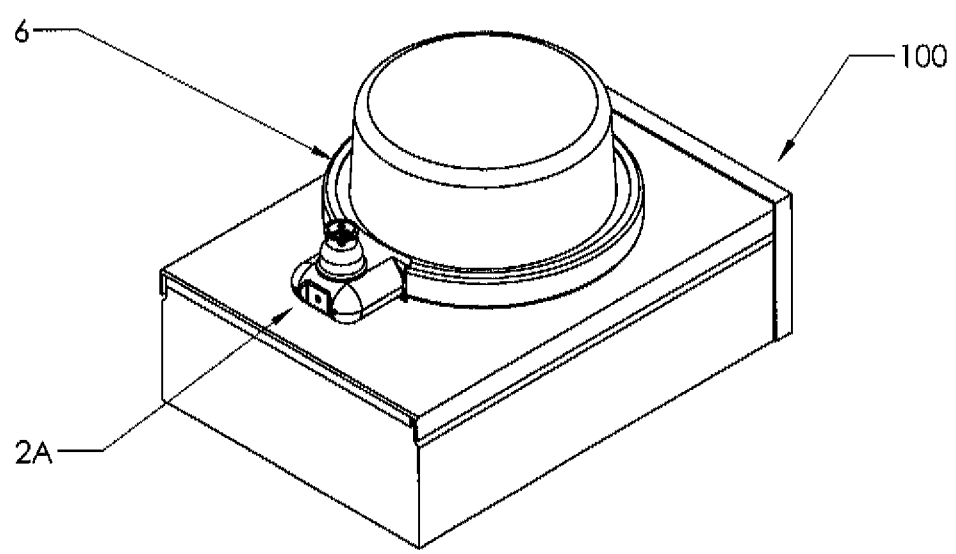
Figure 24:
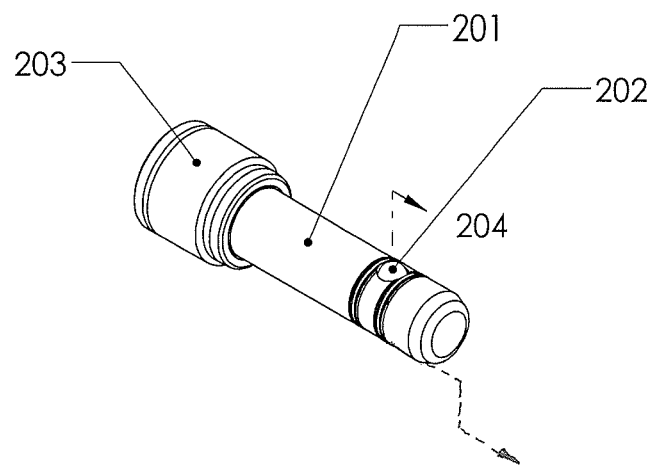
Figure 24:
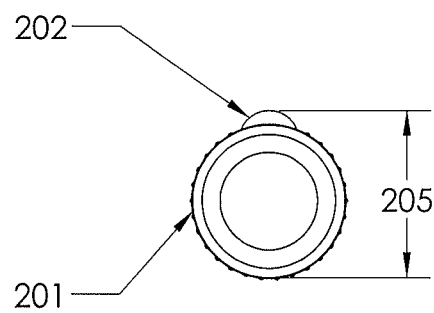
Figure 24:
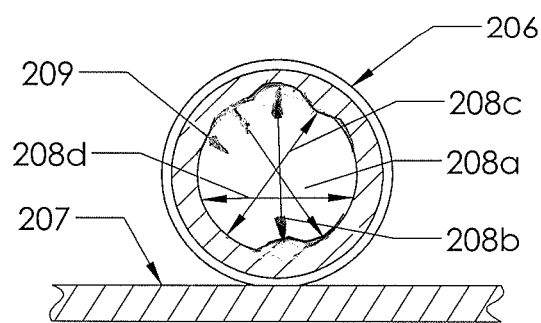
Figure 24:
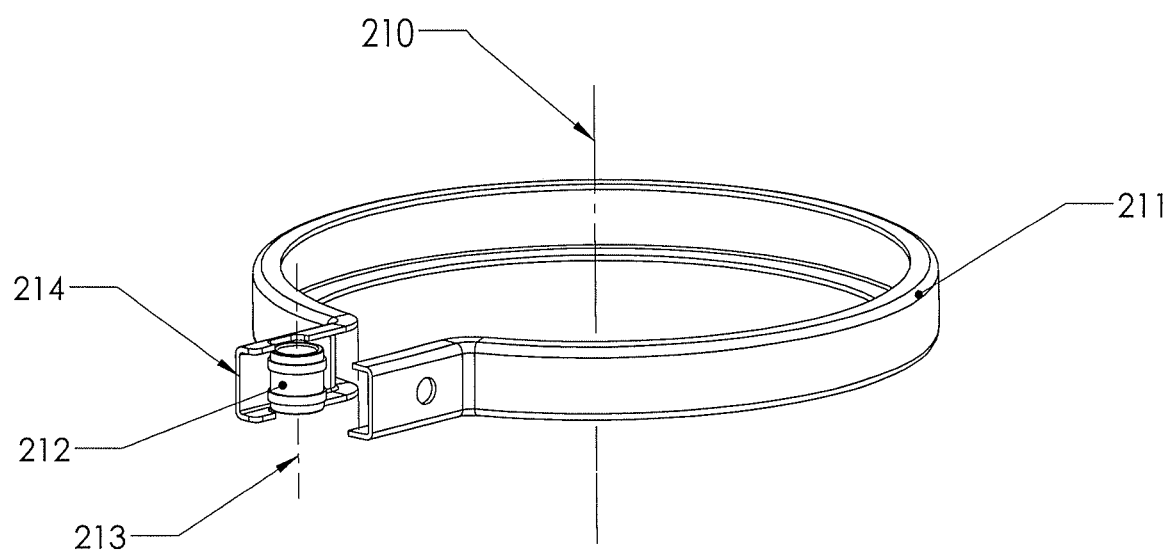

Turning now to FIGS. 18-20, other embodiments are provided which illustrate the lock retainer 5 comprising flanges 18 which inhibit the lock 3 from rotating. The flanges 18 can be made by lancing operation or by extrusion method.

Regarding the rotation restriction features and interoperable surfaces, as noted above, in some example embodiments, such a feature may comprise a projection, ear, lug, protuberance, flat or the like, configured to interact with complementary rotation restriction stop, or anti-rotation, surfaces on a barrel lock or the like. Examples of some rotation restriction surfaces or flats are shown in FIGS. 18, 18A-18I, 19-20, and included in U.S. Pat. No. 7,213,424, FIGS. 15-17a-17h; all written material, figures, content and other disclosure in the above-referenced patent, (as well as their related parent or child continuation, continuation-in-part or divisional applications), is hereby incorporated by reference. FIGS. 18, 18A-18I, 19-20 provide other example embodiments of the lock retainer showing rotation restricted or anti-rotation embodiments of the lock retainer and cooperating barrel lock shank or shaft, showing complementary surfaces 18H1-18H4 and 18I1-18I2.

It should be noted that the lock retainer 5 can be made having various configurations. In an example embodiment, shown in FIG. 13, there may be a variation in the number, shape and size of projection ridges 10 on the outer surface. As noted earlier, in other examples, the retainer may have a variety of suitable outer shapes and configurations, or internal bore configurations, or have an outer surface profile comprising a rectangular, square, polygon or other suitable profile.

Figure 16:
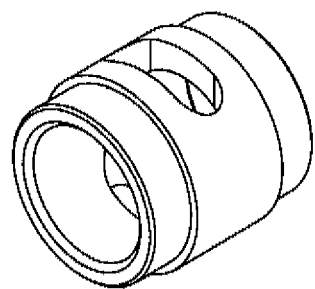
FIG. 16 is another example embodiment of the lock retainer.

In another example, as shown in FIG. 16, the retainer may provide a hole or slot formed or, for example, drilled from the side rather than having an annular recess.

Figure 17:
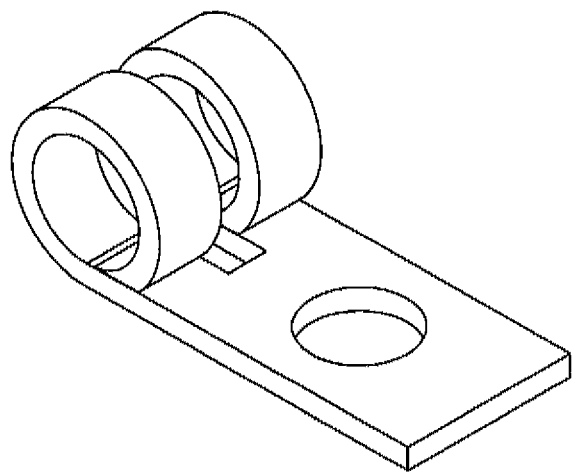
FIG. 17 is another example embodiment of the lock retainer.

In another example embodiment, the retainer may be formed or made out of a stamped part as shown in FIG. 17. In this way, an annularly extending gap formed between the annularly extended flanges as shown would serve to retain the barrel lock balls when in a locked mode. In a further example, the retainer may have one end closed.

In another example, the method of bonding the lock retainer 5 onto the ring 6 may be done in various ways like spot welding, as noted above, or brazing, seam welding, riveting, using other types of mechanical fasteners, adhesives or other attachment or coupling systems. In a further example embodiment, as shown in FIG. 12, a mechanical attachment method comprises using a metal strip 13 around the lock retainer 5"" and fastening it in conjunction with a fastener or using the ring fastener 7, 8.

In another example, a rivet nut system may be used as a fastener. When used with a clip or for example, the embodiments shown in FIG. 11 (for example, modified with a weld bead), 12, or 17, it secures and retains the clip-type retainer in a desired position (and fosters interchangeability if desired); as such, this eliminates the need to weld the clip-type retainer to the ring. Additionally, a rivet nut is easy to assemble, requiring low cost capital equipment; in contrast, taping a hole in the ring is generally more difficult, requiring expensive tooling and providing very limited thread engagement.

As to a further discussion of the manner of usage and operation of the present invention, the same should be apparent from the above description and as illustrated in FIGS. 1-24D generally (which include various views of embodiments including certain members, components, structures, and configurations in accord with possible embodiments of the invention as well as various barrel locking systems (as shown in FIGS. 1-24D generally) and each figure of FIGS. 1-24D generally provides a photograph illustrating various example embodiments corresponding assemblies and components as depicted). As noted, FIGS. 21-24 provide a perspective view of an example embodiment of the invention showing the locking ring and retainer, housing, ferrule, and barrel lock system and methodology for securing an electric meter to an electric meter box 100. In addition, it should be noted regarding FIG. 25D, that various lengths and types of locking devices (barrel lock, plunger locks, anti-rotation barrel locks, and others) may be used. The housing and retaining member may be configured to accommodate any of various sizes and diameters and the receiving elements may be sized and lengthened accordingly. In addition, FIGS. 1-24D generally, it can be seen that once mounted on a meter box the licking ring and retainer and rings ends may be conveniently drawn together to first secure the ring and then the housing and lock can be installed.

An advantage of the current invention is that the lock retaining member is restricted in a way so as to prevent the barrel lock from being manipulated when locked in the ring to remove the lock without unlocking it. Receiving members in the prior art have been formed from sheet metal as shown in FIG. 11. The bore of the prior art retaining member is therefore not uniform and has a gap portion where the two ends of the sheet metal are joined. This gap portion allows the locking member on a barrel lock to be aligned with it and with hand force, pulled through the gap thus allowing the lock to be removed without unlocking the lock.

In an example embodiment of the present invention, the retaining member is designed to have a bore for receiving the shank of a barrel lock. The lock receiving bore is sized so that every chord of the bore is smaller than the maximum chord defined by the shank and the locking member when the lock is in the locked configuration. Referring to FIG. 24A, a barrel lock is shown with shank 201, locking member 202 (a ball in the present embodiment), and head 203. FIG. 24B shows a cross sectional view at 204 in FIG. 24A. In FIG. 24B only the external geometry of the lock is illustrated. FIG. 24B shows a sectional view of the locking member 202, and shank 201. The maximum chord measured between the shank 201 and the locking member 202 is shown by 205. FIG. 24C shows a cross sectional view of an example embodiment lock retaining member 206 attached to a portion of the ring 207. FIG. 25B shows an isometric view of a similar example embodiment with the ring and locking member attached thereto. Referring again to FIG. 24C, chords 208a, 208b, 208c and 208d are examples of chords drawn at different points in the lock receiving bore 209 of the lock retaining member 206. It may be noted that chord 208d does not pass through the center of the lock receiving bore while chord 208b does. The bore 209 is generally circular but may be irregular and of any shape. In the present embodiment, the largest chord that may be measured in the bore is smaller than the largest chord that may be measured between the shank and at least one locking member on the lock. This geometry prevents the lock from being manipulated and removed from the lock retaining member on the ring. In further embodiments of the present invention, the stiffness of the lock retaining member may be increased to reduce flexure of the receiving member. This will prevent the retaining member from being flexed in a way so as to increase the maximum chord to allow a lock to be removed from the locking member without being unlocked. In an example embodiment, FIG. 24D provides a view of an example embodiment of the invention showing a retaining member having a central axis generally parallel to the central axis of the ring (although in other embodiments, these axes may be other than generally parallel).

In an example embodiment, an apparatus and method is provided for securing an electrical meter to a meter socket box. In certain embodiments, the method comprises providing a ring 1 comprising an annular body portion having a split forming first and second ends 6D of the annular body portion, the ring having central axis (e.g., similarly oriented in some embodiments as item 210 in one example embodiment) and further disposing at least a first flange on the first end of the annular body portion. The method further comprises disposing a retaining member 5 on the first flange, the retaining member having a central axis (e.g., similarly oriented in some embodiments as item 213 in one example embodiment) generally parallel to the central axis of the ring. The retaining member may be made from any material suitable for securing a barrel lock or other type locking device. The retaining member is preferably attached to the first ring end (e.g., by welding, fasteners, adhesives, or other fastening systems) but in some embodiments may be loosely captured between the ring ends and cooperatively configured to be aligned with the housing body and receiver element to receive a locking device. The retaining member, in some embodiments, comprises a body defining a bore, 5B wherein the radial cross section is continuous in at least a portion of the bore along the central axis of the retaining member. The method further comprises providing a housing 2A wherein at least a portion of the housing comprises a receiver element 2J and further comprises a housing body defining a cavity, wherein the housing body forms an open end in communication with the cavity so as to receiveably capture at least a portion of the first flange and second end of the annular body portion, and wherein a first aperture 2F is formed through the receiver element. Further, the first aperture is coaxially alignable and in communication with the bore of the retainer so as to receive a barrel lock.

In accordance with one embodiment, a locking ring apparatus and system comprises a ring, fastener, retaining member housing, and a barrel lock being adapted for securing an electrical meter to the flanges of a meter socket box.

In a further example embodiment, the locking ring apparatus comprises a ring comprising an annular body portion having a split forming first and second ends of the annular body portion. In an example embodiment, a first flange is disposed on the first end of the annular body portion. In another example embodiment, a second flange is disposed on the second end of the annular body portion. A ring fastener, in one example, is disposed on the first end of the annular body portion. In further example, the ring fastener is fastenable to an engageable structure disposed on the second end of the annular body portion. Ideally, the engageable structure comprises a ring fastener receiver suitable for receiving the threaded shaft of the ring fastener. It should be noted however that the ring fastener or ring fastener receiver are mounted on opposing rings and that the either of the fastener or fastener receiver may be mounted on either the first or second ring ends. The apparatus further includes at least a retaining member which may be disposed on an end or, in one example, on the first flange. In another example, the retaining member is disposed intermediate the first and second flanges. The retaining member includes at least a body defining a bore, in one example embodiment, having continuous radial cross section in at least a portion of the bore and wherein a retaining recess is formed within the bore and is adapted for retaining the locking members of a barrel lock so as to releaseably capture the barrel lock within the retaining member. In an example, the retaining recess circumferentially extends so as to form a complete annular retaining recess within the bore. In another example, the body defines a bore having continuous radial cross section throughout the bore. The body may have a cylindrical or tubular configuration in various embodiments. The apparatus further includes at least a housing comprising a housing body defining a cavity and further comprising a hollow receiver element. The housing body has an open end in communication with the cavity so as to simultaneously and receiveably capture at least a portion of the first flange and second end (or second flange in some embodiments) of the annular body portion. The hollow receiver element defines an axially extending passage (adapted to receive a barrel lock) in communication with the cavity of the housing body. The passage is coaxially alignable and further in communication with the bore of the retainer so as to receive a barrel lock. In another example, a port is formed in the housing body to aid in draining any unwanted fluids from the housing body. In one example, the housing further comprises an alignment member adapted to align the aperture of the receiver element with the bore of the retainer when the housing receiveably captures the at least a portion of the first flange and second end or flange of the annular body portion. It should also be noted that the housing and retaining member could also be configured, reoriented, and arranged in such a way the barrel lock could be inserted from the side rather than from the front of the ring. In another example, the apparatus further includes a hollow metal ferrule preferably fitted or attached to the housing and being adapted for receiving a sealing tab or wire to indicate tampering.

In another embodiment, the retaining member comprises an annular band having a bore therethrough with the band comprising a first and second openings, such that the locking members pass completely through the band bore after which the locking members may be extended such that they may not pass back through the second end of the bore. In an example, the annular band has a first open end for receiving a barrel lock and an opposing second open end that the barrel lock shank (or shaft having the locking members) may pass through and wherein the second end has an engagement surface for engaging or blocking the locking members (or, in some embodiments, locking balls or ball bearings), when attempting to withdraw (or extract) the lock when the locking members are in the extended, locked mode, (i.e., locked mode, rather than the retracted unlocked mode)

In one example embodiment, the retaining member is disposed (or in other embodiments, formed from or attached) on the first flange by welding (for example, projection welding). The method of attaching the retaining member to the first flange comprises providing ridges, projections, protuberances, or the like used as a surface to weld the retaining member to a first or second ring flange or in other embodiments, the first or second ring ends or other suitable portions of the annular body. In an example embodiment, the retaining member is manufactured by a turning operation, in order to more efficiently make the retaining member features. In this way, the ridges (or projections or protuberances or the like) may also be made or manufactured in the same process or manufacturing operation as the body or other portions of the retaining member.

In another example, the apparatus provides an improvement of existing barrel lock retainers which are used in conjunction with the barrel lock and the ring to secure the watt hour meter.

In another example, the retaining member comprises a cylindrical hole with an annular recess. The locking members, or ball bearings of a barrel lock, engage the at least a portion of surfaces forming the recess and thereby the barrel lock is releaseably captured within the retaining member.

In another example embodiment, the apparatus includes an improvement of an existing barrel lock retaining clip formed from a stamped part. The hole in the existing clip that retains the barrel lock is not continuous and a weld bead or other material may be used to fill in the discontinuous portion of the clip in order to foster a more secure retention of the barrel lock and prevent the locking arrangement from being defeated by joggling or wiggling the barrel lock out of the hole in the existing clip. In another example embodiment, the barrel lock retainer has a continuous hole.

In a further example embodiment of the invention in use, a method is provided for securing an electrical meter to a meter socket box, the method comprising: providing a ring comprising an annular body portion having a split forming first and second ends of the annular body portion; providing a ring fastener, in one example, disposed on the first end of the annular body portion, wherein the ring fastener is fastenable to an engageable structure disposed on the second end of the annular body portion, and wherein the engageable structure comprises a ring fastener receiver suitable for receiving the threaded shaft of the ring fastener; and further disposing a first flange on the first end of the annular body portion, and disposing a second flange on the second end annular body portion; disposing a retaining member between the first flange and second flange; wherein the retaining member comprises as a cylindrical body defining a tubular bore (in one example embodiment) having continuous radial cross section in at least a portion of the bore; providing a housing wherein at least a portion of the housing comprises a receiver element and further comprises a housing body defining a cavity; wherein the housing body forms an open end in communication with the cavity so as to receiveably capture at least a portion of the first flange and second flange of the annular body portion (or in another example embodiment, both the first and a second ends of the annular body portion); and wherein a first aperture is formed through the receiver element, and wherein the first aperture is coaxially alignable and in communication with the bore of the retainer so as to receive a barrel lock; and wherein a barrel lock may be simultaneously received in the receiver element and the bore of the retainer so as to secure the housing to the annular ring.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention. The embodiments described herein are meant to be examples of the present invention and in no way are intended to limit the scope of the invention.

The design described does not limit the scope of the embodiments of invention; the number of various elements may change, or various components may be added or removed to the above-described concept, for example, to aid in improved security and operation.

The foregoing disclosure and description of embodiments of the invention is illustrative and explanatory of the above and variations thereof, and it will be appreciated by those skilled in the art, that various changes in the design, organization, order of operation, means of operation, equipment structures and location, methodology, the use of mechanical equivalents, such as different types of fasteners and locking devices than as illustrated whereby different steps may be utilized, as well as in the details of the illustrated construction or combinations of features of the various elements may be made without departing from the spirit of the embodiments of the invention. As well, the drawings are intended to describe various concepts of embodiments of the invention so that presently preferred embodiments of the invention will be plainly disclosed to one of skill in the art but are not intended to be manufacturing level drawings or renditions of final products and may include simplified conceptual views as desired for easier and quicker understanding or explanation of embodiments of the invention. As well, the relative size and arrangement of the components may be varied from that shown and the embodiments of the invention still operate well within the spirit of the embodiments of the invention as described hereinbefore and in the appended claims. Thus, various changes and alternatives may be used that are contained within the spirit of the embodiments of the invention.

Accordingly, the foregoing specification is provided for illustrative purposes only, and is not intended to describe all possible aspects of the example embodiments of the invention. It will be appreciated by those skilled in the art, that various changes in the ordering of steps, ranges, interferences, spacings, hardware, and/or attributes and parameters, as well as in the details of the illustrations or combinations of features of the methods and system discussed herein, may be made without departing from the spirit of the embodiments of the invention. Moreover, while various embodiments of the invention have been shown and described in detail, those of ordinary skill in the art will appreciate that changes to the description, and various other modifications, omissions and additions may also be made without departing from either the spirit or scope thereof.

REFERENCES

The following references, as noted herein, including the content and disclosure of each of the following applications/publications, as well as their related parent or child continuation, continuation-in-part or divisional applications, as permitted are specifically hereby incorporated by reference: U.S. Pat. Nos. 4,742,703, 6,386,006, 7,213,424, 7,176,376; and U.S. patent application Nos. 61/381,441, U.S. Ser. Nos. 12/380,938, 12/378,879, 12/317,086, 12/082,122, 61/316, 851, 61/293,724; and U.S. patent application Nos. 12/763, 170 and 61/316,910.

Additionally, all written material, figures, content and other disclosure in each of the above-referenced applications, as well as their related parent or child continuation, continuation-in-part or divisional applications, is hereby incorporated by reference. In addition, the instant application claims priority to Application No. 61/381,441.

What is claimed is:

1. A method for securing an electrical meter to a meter socket box, the method comprising:

providing a ring comprising an annular body portion having a split forming first and second ends of the annular body portion, the ring having a central axis;
disposing at least a first flange on the first end of the annular body portion;
disposing a retaining member on the first flange, the retaining member having a central axis generally parallel to the central axis of the ring;
wherein the retaining member comprises a body defining an elongated bore formed for locking a barrel lock, and wherein the radial cross section is continuous in at least a portion of the elongated bore along the central axis of the retaining member;
providing a housing wherein at least a portion of the housing comprises a receiver element and further comprises a housing body defining a cavity;
wherein the housing body forms an open end in communication with the cavity so as to receiveably capture at least a portion of the first flange and second end of the annular body portion; and
wherein a first aperture is formed through the receiver element, wherein the first aperture is coaxially alignable and in communication with the elongated bore of the retaining member body so as to releaseably capture the barrel lock, wherein the housing may be secured to the ring.

2. The method of claim 1, further comprising the step of disposing a second flange on the second end of the annular body portion.

3. The method of claim 2, further comprising the step of disposing a ring fastener on the first flange of the annular body portion and disposing an engageable structure on the second flange of the annular body portion, the ring fastener being fastenable to the engageable structure.

4. The method of claim 3, wherein the ring fastener comprises a threaded shaft, and wherein the engageable structure comprises a ring fastener receiver suitable for receiving the threaded shaft of the ring fastener.

5. The method of claim 2, wherein the retaining member is disposed intermediate the first and second flanges.

6. The method of claim 1, wherein a retaining recess is formed within the elongated bore of the retaining member body and is configured for retaining a locking member of the barrel lock so as to releaseably capture the barrel lock within the retaining member.

7. The method of claim 1, wherein the retaining recess circumferentially extends so as to form a complete annular retaining recess within the elongated bore.

8. An apparatus for securing an electrical meter to a meter socket box, the apparatus comprising:
a ring comprising an annular body portion having a split forming first and second ends of the annular body portion, the ring having a central axis;
a first flange disposed on the first end of the annular body portion;
a retaining member disposed on the first flange, the retaining member having a central axis generally parallel to the central axis of the ring;
wherein the retaining member comprises a body defining an elongated bore formed for locking a barrel lock, and wherein the radial cross section is continuous in at least a portion of the elongated bore along the central axis of the retaining member;
providing a housing wherein at least a portion of the housing comprises a receiver element and further comprises a housing body defining a cavity;
wherein the housing body forms an open end in communication with the cavity so as to receiveably capture at least a portion of the first flange and second end of the annular body portion; and
wherein a first aperture is formed through the receiver element, wherein the first aperture is coaxially alignable and in communication with the elongated bore of the retaining member body so as to releaseably capture the barrel lock, wherein the housing may be secured to the ring.

9. The apparatus of claim 8, further comprising a second flange disposed on the second end of the annular body portion.

10. The apparatus of claim 9, further comprising a ring fastener disposed on the first flange of the annular body portion and an engageable structure disposed on the second flange of the annular body portion, the ring fastener being fastenable to the engageable structure.

11. The apparatus of claim 10, wherein the ring fastener comprises a threaded shaft, and wherein the engageable structure comprises a ring fastener receiver suitable for receiving the threaded shaft of the ring fastener.

12. The apparatus of claim 9, wherein the retaining member is disposed intermediate the first and second flanges.

13. The apparatus of claim 8, wherein a retaining recess is formed within the elongated bore of the retaining member body and is configured for retaining a locking member of the barrel lock so as to releaseably capture the barrel lock within the retaining member.

14. The apparatus of claim 13, wherein the retaining recess circumferentially extends around an interior surface forming the bore of the retaining member so as to form a complete annular retaining recess within the elongated bore.

15. The apparatus of claim 8, wherein the bore comprises at least one chord, and wherein when a configuration of the bore comprises more than one chord, one chord is sized so that every chord of the bore is smaller than the maximum chord defined by the shank, and wherein the locking member comprises at least one locking member when the lock is in a locked configuration, and wherein the lock retaining member comprises a stiffened material to reduce flexure of the receiving member.

16. The apparatus of claim 8, wherein the bore comprises at least one chord, and wherein when a configuration of the bore comprises more than one chord, the largest chord that may be measured in the bore is smaller than the largest chord that may be measured between the shank and at least one locking member on the lock.

17. The apparatus of claim 15, further comprising a plurality of chords, wherein at least one chord does not pass through the center of the lock receiving bore, and wherein at least one chord does pass through the center of the bore.

18. An apparatus for securing an electrical meter to a meter socket box, the apparatus comprising:
a ring comprising an annular body portion having a split forming first and second ends of the annular body portion, the ring having a central axis;
a first flange disposed on the first end of the annular body portion, and further comprising a second flange disposed on the second end of the annular body portion;
a retaining member disposed intermediate the first and second flanges, the retaining member having a central axis generally parallel to the central axis of the ring;
wherein the retaining member comprises a body defining an elongated bore formed for locking a barrel lock, and wherein the radial cross section is continuous in at least a portion of the elongated bore along the central axis of the retaining member;

providing a housing wherein at least a portion of the housing comprises a receiver element and further comprises a housing body defining a cavity;

wherein the housing body forms an open end in communication with the cavity so as to receiveably captures at least a portion of the first and second flanges; and wherein a first aperture is formed through the receiver element, and wherein the housing further comprises an alignment member having structural elements adapted to align the aperture of the first aperture of the receiver element with the elongated bore of the retainer member, and wherein the first aperture is coaxially alignable and in communication with the elongated bore of the retaining member body so as to releaseably capture the barrel lock, wherein the housing may be secured to the ring.

19. The apparatus of claim 18, further comprising a ring fastener disposed on the first flange of the annular body portion and an engageable structure disposed on the second flange of the annular body portion, the ring fastener being fastenable to the engageable structure.

20. The apparatus of claim 19, wherein the elongated bore comprises an interior surface, and wherein a retaining recess is formed within the interior surface, the retaining recess circumferentially extending around the interior surface so as to form a complete annular retaining recess within the elongated bore, wherein the retaining recess is configured for retaining a locking member of the barrel lock so as to releaseably capture the barrel lock within the retaining member.

* * * * *